(12) United States Patent
Wang et al.

(10) Patent No.: US 12,069,924 B2
(45) Date of Patent: Aug. 20, 2024

(54) DISPLAY SUBSTRATE AND MANUFACTURING METHOD THEREOF, AND DISPLAY DEVICE HAVING A PLURALITY OF APERTURES IN A ONE-TO-ONE CORRESPONDENCE TO A PLURALITY OF FIRST ELECTRODES

(71) Applicants: Chengdu BOE Optoelectronics Technology Co., Ltd., Sichuan (CN); BOE Technology Group Co., Ltd., Beijing (CN)

(72) Inventors: Rong Wang, Beijing (CN); Bo Zhang, Beijing (CN); Xiangdan Dong, Beijing (CN); Xiaoqing Shu, Beijing (CN); Mengmeng Du, Beijing (CN); Shuangbin Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 561 days.

(21) Appl. No.: 17/416,078

(22) PCT Filed: Jun. 19, 2020

(86) PCT No.: PCT/CN2020/097124
§ 371 (c)(1),
(2) Date: Jun. 18, 2021

(87) PCT Pub. No.: WO2021/103504
PCT Pub. Date: Jun. 3, 2021

(65) Prior Publication Data
US 2022/0077244 A1 Mar. 10, 2022

(30) Foreign Application Priority Data

Nov. 29, 2019 (WO) ................ PCT/CN2019/122156
Nov. 29, 2019 (WO) ................ PCT/CN2019/122184
Nov. 29, 2019 (WO) ................ PCT/CN2019/122201

(51) Int. Cl.
*H10K 59/35* (2023.01)
*G09G 3/3266* (2016.01)
(Continued)

(52) U.S. Cl.
CPC ......... *H10K 59/353* (2023.02); *G09G 3/3266* (2013.01); *G09G 3/3275* (2013.01);
(Continued)

(58) Field of Classification Search
CPC .............. H10K 59/353; H10K 59/122; H10K 59/131; H10K 59/1201; G09G 3/3266;
(Continued)

(56) References Cited

U.S. PATENT DOCUMENTS 10,566,402 B2 * 2/2020 Cho .................... H01L 27/1255
10,901,314 B2 * 1/2021 Ji .......................... H10K 71/00
(Continued)

FOREIGN PATENT DOCUMENTS

CN 101872096 A 10/2010
CN 102436104 A 5/2012
(Continued)

OTHER PUBLICATIONS

Office Action dated Jan. 5, 2023 issued in corresponding U.S. Appl. No. 17/876,689.
(Continued)

*Primary Examiner* — Khiem D Nguyen
(74) *Attorney, Agent, or Firm* — Nath, Goldberg & Meyer; Joshua B. Goldberg

(57) ABSTRACT

A display substrate is provided. The display substrate includes a pixel defining layer having a plurality of apertures corresponding to the sub pixels of at least two different colors. Orthographic projections of the plurality of apertures on the base substrate each are divided by the orthographic projections of the plurality of first power supply lines on the base substrate into a first portion and a second portion. For the sub pixels of the at least two different colors, a first area ratio is a ratio between areas of the first portions of the orthographic projections of the apertures on the base substrate, a second area ratio is a ratio between areas of the
(Continued)

second portions of the orthographic projections of the apertures on the base substrate, and a ratio between the first area ratio and the second area ratio is in a range from 0.8 to 1.2.

17 Claims, 12 Drawing Sheets

(51) Int. Cl.
  *G09G 3/3275* (2016.01)
  *H10K 59/122* (2023.01)
  *H10K 59/131* (2023.01)
  *H10K 59/12* (2023.01)

(52) U.S. Cl.
  CPC ......... *H10K 59/122* (2023.02); *H10K 59/131* (2023.02); *G09G 2300/0842* (2013.01); *H10K 59/1201* (2023.02)

(58) Field of Classification Search
  CPC ......... G09G 3/3275; G09G 2300/0452; G09G 2300/0465; G09G 3/3233
  See application file for complete search history.

(56) References Cited

U.S. PATENT DOCUMENTS

| | | |
|---|---|---|
| 11,437,457 B2 | 9/2022 | Yang et al. |
| 2001/0055828 A1 | 12/2001 | Kaneko et al. |
| 2014/0319479 A1 | 10/2014 | Park et al. |
| 2015/0008820 A1 | 1/2015 | Lee |
| 2015/0102303 A1 | 4/2015 | Kim |
| 2015/0102319 A1 | 4/2015 | Jeon |
| 2015/0214284 A1 | 7/2015 | Kim |
| 2015/0261050 A1 | 9/2015 | Chen et al. |
| 2016/0155792 A1* | 6/2016 | Wang ................ H01L 29/78672 257/40 |
| 2016/0190173 A1 | 6/2016 | Lee et al. |
| 2016/0210905 A1 | 7/2016 | Lee et al. |
| 2016/0225834 A1 | 8/2016 | Kim et al. |
| 2016/0225838 A1 | 8/2016 | Im |
| 2017/0025487 A1* | 1/2017 | Byun ................ H10K 59/1216 |
| 2017/0263567 A1 | 9/2017 | Moon et al. |
| 2017/0331066 A1 | 11/2017 | Jeon |
| 2018/0277040 A1* | 9/2018 | Lee ...................... H10K 50/805 |
| 2018/0342570 A1* | 11/2018 | Hong .................. H10K 59/123 |
| 2019/0027546 A1 | 1/2019 | Lee |
| 2019/0103455 A1 | 4/2019 | Song et al. |
| 2019/0131371 A1 | 5/2019 | Yi et al. |
| 2019/0140043 A1 | 5/2019 | Wang et al. |
| 2019/0196630 A1 | 6/2019 | Lai et al. |
| 2019/0355802 A1* | 11/2019 | Shim .................... H10K 59/131 |
| 2019/0393283 A1 | 12/2019 | Lu et al. |
| 2020/0043406 A1 | 2/2020 | Cha et al. |
| 2020/0058728 A1 | 2/2020 | Song et al. |
| 2020/0119114 A1 | 4/2020 | Kim et al. |
| 2020/0243600 A1 | 7/2020 | Tzeng et al. |
| 2021/0066642 A1 | 3/2021 | Lee et al. |
| 2021/0343226 A1 | 11/2021 | Okabe et al. |

FOREIGN PATENT DOCUMENTS

| | | | |
|---|---|---|---|
| CN | 104124263 | A | 10/2014 |
| CN | 104282717 | A | 1/2015 |
| CN | 105720071 | A | 6/2016 |
| CN | 105938704 | A | 9/2016 |
| CN | 106469745 | A | 3/2017 |
| CN | 106910765 | A | 6/2017 |
| CN | 108563353 | A | 9/2018 |
| CN | 108598136 | A | 9/2018 |
| CN | 108922919 | A | 11/2018 |
| CN | 208173203 | U | 11/2018 |
| CN | 108933155 | A | 12/2018 |
| CN | 109119028 | A | 1/2019 |
| CN | 109148522 | A | 1/2019 |
| CN | 208335702 | U | 1/2019 |
| CN | 109360851 | A | 2/2019 |
| CN | 109378329 | A | 2/2019 |
| CN | 109962096 | A | 7/2019 |
| CN | 110071158 | A | 7/2019 |
| CN | 110246864 | A | 9/2019 |
| CN | 110265458 | A | 9/2019 |
| CN | 110503918 | A | 11/2019 |
| EP | 2830095 | A2 | 1/2015 |
| EP | 3293767 | A2 | 3/2018 |
| JP | 2018189965 | A | 11/2018 |

OTHER PUBLICATIONS

Office Action dated Nov. 11, 2022 issued in corresponding Chinese Application No. 202080001059.6.
Extended Search Report dated Oct. 24, 2022 issued in corresponding European Application No. 19945420.8.
Extended Search Report dated Nov. 8, 2022 issued in corresponding European Application No. 19945463.8.
Extended Search Report dated Jan. 3, 2023 issued in corresponding European Application No. 20892526.3.
Partial Supplementary Search Report dated Nov. 3, 2022 issued in corresponding European Application No. 19945468.7.
Extended European Search Report dated Mar. 10, 2023 corresponding to application No. 19945468.7-1212.
Office Action dated Jan. 21, 2022 issued in corresponding U.S. Appl. No. 17/255,686.
Chinese First Office Action dated Jun. 26, 2023 corresponding to application No. 201980002732.5.
First Office Action dated Aug. 25, 2023 corresponding to U.S. Appl. No. 16/977,866.
Second Office Action dated Jun. 26, 2023 corresponding to U.S. Appl. No. 17/876,689.
First Office Action dated Aug. 11, 2023 corresponding to U.S. Appl. No. 16/976,545.
Notice of Reasons for Refusal dated Sep. 29, 2023 corresponding to Japanese application No. 2021-570003.
Notice of Allowance dated Nov. 30, 2023 corresponding to U.S. Appl. No. 16/976,545.
Notice of Allowance dated Oct. 5, 2023 corresponding to U.S. Appl. No. 17/876,689.
International Search Report issued on Aug. 21, 2020 for application No. PCT/CN2019/122184 with English translation attached.
International Search Report issued on Aug. 26, 2020 for application No. PCT/CN2019/122201 with English translation attached.
International Search Report issued on Aug. 27, 2020 for application No. PCT/CN2019/122156 with English translation attached.
First Office Action issued on Apr. 25, 2022 for application No. CN201980002728.9 with English translation attached.

* cited by examiner

Ca

30

DISPLAY SUBSTRATE AND MANUFACTURING METHOD THEREOF, AND DISPLAY DEVICE HAVING A PLURALITY OF APERTURES IN A ONE-TO-ONE CORRESPONDENCE TO A PLURALITY OF FIRST ELECTRODES

This is a National Phase Application filed under 35 U.S.C. 371 as a national stage of PCT/CN2020/097124, filed Jun. 19, 2020, an application claiming the benefit of Application No. PCT/CN2019/122201, filed Nov. 29, 2019, Application No. PCT/CN2019/122184, filed Nov. 29, 2019, and Application No. PCT/CN2019/122156, filed Nov. 29, 2019, the content of each of which is hereby incorporated by reference in its entirety.

TECHNICAL FIELD

The present disclosure relates to the field of display technology, and in particular to a display substrate and a manufacturing method thereof, and a display device.

BACKGROUND

With rapid development of an active-matrix organic light emitting diode (AMOLED) display device, it becomes an inevitable trend to optimize a pixel structure so as to enhance display quality of an AMOLED display device.

SUMMARY

According to one aspect of the present disclosure, a display substrate is provided. The display substrate includes: a base substrate; and a plurality of sub pixels on the base substrate, wherein the plurality of sub pixels includes: a first metal layer on the base substrate, the first metal layer including a plurality of first power supply lines; a first planarization layer on a side of the first metal layer distal to the base substrate; a first electrode layer on a side of the first planarization layer distal to the first metal layer and provided with a plurality of first electrodes spaced apart from each other; and a pixel defining layer on a side of the first electrode layer distal to the first planarization layer, and having a plurality of apertures which are in a one-to-one correspondence with the plurality of first electrodes and make the plurality of first electrodes exposed, the plurality of apertures being provided corresponding to sub pixels of at least two different colors, and wherein orthographic projections of the plurality of apertures corresponding to the sub pixels of at least two different colors on the base substrate each are divided by the orthographic projections of the plurality of first power supply lines on the base substrate into a first portion at a first side of one corresponding power supply line of the plurality of first power supply line and a second portion at a second side of the one corresponding first power supply line of the plurality of first power supply lines, and for the sub pixels of the at least two different colors, a first area ratio is a ratio between areas of the first portions of the orthographic projections of the apertures of the sub pixels of the at least two different colors on the base substrate, a second area ratio is a ratio between areas of the second portions of the orthographic projections of the apertures of the sub pixels of the at least two different colors on the base substrate, and a ratio between the first area ratio and the second area ratio is in a range from 0.8 to 1.2.

In some embodiments, the sub pixels of the at least two different colors include first sub pixels of a first color, the plurality of first power supply lines extend in a first direction, the first portion and the second portion are arranged at two sides of one corresponding first power supply line in a second direction respectively, the first direction crosses over the second direction, the plurality of first power supply lines include first sub power supply lines in parallel with each other, orthographic projections of corresponding apertures of the first sub pixels are divided by orthographic projections of the first sub power supply lines on the base substrate into the first portions and the second portions, respectively, the first sub power supply line includes a first repeating part and a second repeating part which are coupled to each other and are combined as a repeating unit, the orthogonal projection of the aperture of the first sub pixel on the base substrate overlaps with the orthogonal projections of the first repeating part and the second repeating part of a corresponding first sub power supply line on the base substrate, and an overlapping area of the orthogonal projection of the aperture of the first sub pixel on the base substrate with the orthogonal projection of the first repeating part on the base substrate is larger than an overlapping area of the orthogonal projection of the aperture of the first sub pixel on the base substrate with the orthogonal projection of the second repeating part on the base substrate.

In some embodiments, the first sub pixel of the first color includes a red sub pixel (R) or a blue sub pixel (B), with respect to a central axis along the first direction of the second repeating part, a central axis along the first direction of the first repeating part is distal to the second portion (R2, B2) of the orthogonal projection of the aperture of a corresponding red sub pixel (R) or a corresponding blue sub pixel (B), and the first repeating part is concave relative to the second repeating part on a side proximal to the second portion (R2, B2) of the orthogonal projection of the aperture of the corresponding red sub pixel (R) or the corresponding blue sub pixel (B).

In some embodiments, the sub pixels of the at least two different colors further include second sub pixels of a second color different from the first color, the plurality of first power supply lines further include second sub power supply lines arranged in parallel with the first sub power supply lines, and the second sub power supply lines and the first sub power supply lines are arranged alternately along the first direction, the second sub power supply line includes a third repeating part, a fourth repeating part, and a fifth repeating part which are sequentially coupled to each other and are combined as a repeating unit, an orthographic projection of the second sub pixel on the base substrate overlaps with orthographic projections of the fourth repeating part and the fifth repeating part of a corresponding second sub power supply line on the base substrate, and an overlapping area of the orthographic projection of the aperture of the second sub pixel on the base substrate with the orthographic projection of the fifth repeating part on the base substrate is larger than an overlapping area of the orthographic projection of the aperture of the second sub pixel on the base substrate with the orthographic projection of the fourth repeating part on the base substrate.

In some embodiments, the sub pixels of the at least two different colors further include third sub pixels having a same second color as the second sub pixel, and an orthographic projection of the aperture of the third sub pixel on the base substrate overlaps with an orthographic projection of the fifth repeating part of a corresponding second sub power supply line on the base substrate.

In some embodiments, the second and third sub pixels of the second color each include a green sub pixel, a central axis along the first direction of the third repeating part, a central axis along the first direction of the fourth repeating part and a central axis along the first direction of the fifth repeating part are sequentially approaching the second portion (G2) of the orthographic projection of the aperture of a corresponding green sub pixel (G), the third repeating part is concave relative to the fourth repeating part at a side proximal to the second portion (G2) of the orthographic projection of the aperture of the corresponding green sub pixel (G), and the fifth repeating part is concave relative to the fourth repeating part at a side distal to the second portion (G2) of the orthographic projection of the aperture of the corresponding green sub pixel (G).

In some embodiments, a line width of the first repeating part is in a range from 3 μm to 4.6 μm, a line width of the second repeating part is in a range from 4.5 μm to 6.9 μm, a line width of the third repeating part is in a range from 3 μm to 4.6 μm, a line width of the fourth repeating part is in a range from 5.3 μm to 8.1 μm, and a line width of the fifth repeating part is in a range from 2.4 μm to 3.6 μm.

In some embodiments, the line width of the first repeating part is 3.8 μm, the line width of the second repeating part is 5.7 μm, the line width of the third repeating part is 3.8 μm, the line width of the fourth repeating part is 6.7 μm, and the line width of the fifth repeating part is 3.0 μm.

In some embodiments, the display substrate further includes: a second metal layer which is on the base substrate and includes a plurality of second power supply lines extending along the first direction, wherein orthogonal projections of the plurality of first power supply lines on the substrate and orthogonal projections of the plurality of second power supply lines on the substrate at least partially cross over each other in a direction perpendicular to the base substrate; and a second planarization layer on the second metal layer, wherein the first metal layer is on the second planarization layer, and the plurality of first power supply lines are coupled to the plurality of second power supply lines by vias penetrating through the second planarization layer, respectively.

In some embodiments, the display substrate further includes a plurality of third power supply lines, wherein the plurality of third power supply lines extend along the second direction and electrically couple the plurality of first power supply lines together, orthographic projections of the plurality of third power supply lines on the base substrate and an orthographic projection of the aperture of each of the sub pixels on the base substrate do not overlap with each other in the direction perpendicular to the base substrate, and the plurality of third power supply lines and the plurality of first power supply lines are in a same layer and are a structure formed as a single piece.

In some embodiments, each of the plurality of third power supply lines includes a third sub power supply line and a fourth sub power supply line which are coupled to each other and are combined as a repeating unit, the third sub power supply lines and the fourth sub power supply lines are alternately arranged in the second direction, and the plurality of third power supply lines are arranged along the first direction; the third sub power supply line includes a sixth repeating part, a seventh repeating part, and an eighth repeating part which are sequentially coupled to each other and are combined as a repeating unit, the seventh repeating part extends along the second direction, an extending direction of the sixth repeating part crosses over both the first direction and the second direction, and an extending direction of the eighth repeating part crosses over both the first direction and the second direction and is different from the extending direction of the sixth repeating part; and the fourth sub power supply line includes a ninth repeating part and a tenth repeating part, the ninth repeating part extends along the second direction, and an extending direction of the tenth repeating part crosses over both the first direction and the second direction.

In some embodiments, the sub pixels of the at least two different colors includes red sub pixels (R), blue sub pixels (B), and green sub pixels (G), the red sub pixels (R) and the blue sub pixels (B) are alternately arranged in the first direction and the second direction respectively, and the fourth sub power supply line is between the second portion (R2) of the orthogonal projection of the aperture of the red sub pixel (R) on the base substrate and the second portion (B2) of the orthogonal projection of the aperture of an adjacent blue sub pixel (B) on the base substrate along the first direction; and the green sub pixels (G) are arranged along the first direction and the second direction, and the third sub power supply line is between the second portions (G2) of orthographic projections of apertures of two adjacent green sub pixels (G) on the substrate along the first direction.

In some embodiments, one pixel includes a red sub pixel (R) and a blue sub pixel (B), the orthographic projections of the apertures of the red sub pixel (R) and the blue sub pixel (B) each are divided into a first portion and a second portion by the orthographic projections of corresponding first power supply lines on the base substrate, and an area ratio between the first portion (R1) of the orthographic projection of the aperture of the red sub pixel (R) and the first portion (B1) of the orthographic projection of the aperture of the blue sub pixel (B) is R1/B1, and an area ratio between the second portion (R2) of the orthographic projection of the aperture of the red sub pixel (R) and the second portion (B2) of the orthographic projection of the aperture of the blue sub pixel (B) is R2/B2, wherein R1/B1=R2/B2=1:1.644.

In some embodiments, one pixel includes a red sub pixel (R) and a green sub pixel (G), an area ratio between the first portion (R1) of the orthographic projection of the aperture of the red sub pixel (R) and the first portion (G1) of the orthographic projection of the aperture of the green sub pixel (G) is R1/G1, and an area ratio between the second portion (R2) of the orthographic projection of the aperture of the red sub pixel (R) and the second portion (G2) of the orthographic projection of the aperture of the green sub pixel (G) is R2/G2, wherein R1/G1=R2/G2=1:1.04.

In some embodiments, one pixel includes a blue sub pixel (B) and a green sub pixel (G), an area ratio between the first portion (B1) of the orthographic projection of the aperture of the blue sub pixel (B) and the first portion (G1) of the orthographic projection of the aperture of the green sub pixel (G) is B1/G1, and an area ratio between the second portion (B2) of the orthographic projection of the aperture of the blue sub pixel (B) and the second portion (G2) of the orthographic projection of the aperture of the green sub pixel (G) is B2/G2, wherein B1/G1=B2/G2=1.644:1.04.

In some embodiments, one pixel includes a red sub pixel (R), a first green sub pixel (G') and a second green sub pixel (G"), an area ratio between the first portion (R1) of the orthographic projection of the aperture of the red sub pixel (R) and a sum of the first portion (G'1) of the orthographic projection of the aperture of the first green sub pixel (G') and the first portion (G"1) of the orthographic projection of the aperture of the second green sub pixel (G") is R1/(G'1+G"1), and an area ratio between the second portion (R2) of the orthographic projection of the aperture of the red sub pixel (R) and a sum of the second portion (G'2) of the orthographic projection of the aperture of the first green sub pixel (G') and the second portion (G"2) of the orthographic projection of the aperture of the second green sub pixel (G") is R2/(G'2+G"2), wherein R1/(G'1+G"1)=R2/(G'2+G"2)=1: 1.04.

In some embodiments, one pixel includes a blue sub pixel (B), a first green sub pixel (G') and a second green sub pixel (G"), an area ratio between the first portion (B1) of the orthographic projection of the aperture of the blue sub pixel (B) and a sum of the first portion (G'1) of the orthographic projection of the aperture of the first green sub pixel (G') and the first portion (G"1) of the orthographic projection of the aperture of the second green sub pixel (G") is B1/(G'1+G"1), and an area ratio between the second portion (B2) of the orthographic projection of the aperture of the blue sub pixel (B) and a sum of the second portion (G'2) of the orthographic projection of the aperture of the first green sub pixel (G') and the second portion (G"2) of the orthographic projection of the aperture of the second green sub pixel (G") is B2/(G'2+G"2), wherein B1/(G'1+G"1)=B2/(G'2+G"2) =1.644:1.04.

In some embodiments, the plurality of sub pixels includes a plurality of pixel circuits for driving light emitting elements of the plurality of sub pixels to emit light, respectively; the plurality of pixel circuits in the plurality of sub pixels are arranged in multiple rows and multiple columns along a first direction and a second direction; each of the plurality of pixel circuits includes a driving sub circuit, a data writing sub circuit, a compensation sub circuit and a storage sub circuit; the driving sub circuit includes a control terminal, a first terminal and a second terminal, and is configured to be coupled to the light emitting element and control a driving current flowing through the light emitting element; the data writing sub circuit includes a control terminal, a first terminal and a second terminal, the control terminal of the data writing sub circuit is configured to receive a first scanning signal, the first terminal of the data writing sub circuit is configured to receive a data signal, the second terminal of the data writing sub circuit is electrically coupled to the driving sub circuit, and the data writing sub circuit is configured to write the data signal into the first terminal of the driving sub circuit in response to the first scanning signal; the compensation sub circuit includes a control terminal, a first terminal and a second terminal, the control terminal of the compensation sub circuit is configured to receive a second scanning signal, the first terminal and the second terminal of the compensation sub circuit are respectively electrically coupled to the control terminal and the second terminal of the driving sub circuit, and the compensation sub circuit is configured to perform a threshold compensation on the driving sub circuit in response to the second scanning signal; the storage sub circuit is electrically coupled to the control terminal of the driving sub circuit and a first voltage terminal, and is configured to store the data signal; the storage sub circuit includes a storage capacitor, a first capacitor electrode of the storage capacitor is coupled to the first voltage terminal, a second capacitor electrode is electrically coupled to the control terminal of the driving sub circuit, and the first voltage terminal is coupled to the plurality of first power supply lines; and the plurality of sub pixels include a first sub pixel and a second sub pixel directly adjacent to each other in the second direction, and the first capacitor electrode in the first sub pixel and the first capacitor electrode in the second sub pixel are in a same layer and are spaced apart from each other.

In some embodiments, the display substrate further includes a plurality of data lines extending along the first direction, wherein the plurality of data lines are configured to provide data signals to the plurality of sub pixels.

In some embodiments, the plurality of second power supply lines are in a same layer as the plurality of data lines, and are electrically insulated from the plurality of data lines.

In some embodiments, the light emitting element of each of the plurality of sub pixels includes the first electrode, a light emitting layer, and a second electrode, which are sequentially stacked on the base substrate, the first electrode is on a side of the light emitting layer proximal to the base substrate; and an orthogonal projection of the third power supply line on the base substrate and an orthogonal projection of the first electrode of each of the plurality of sub pixels on the base substrate do not overlap with each other in a direction perpendicular to the base substrate.

According to another aspect of the present disclosure, a display device is further provided. The display device includes the display substrate of any one above.

According to another aspect of the present disclosure, a method for manufacturing a display substrate is further provided. The method includes: providing a base substrate; forming a plurality of sub pixels on the base substrate, wherein each of the plurality of sub pixels includes: a first metal layer on the base substrate, the first metal layer including a plurality of first power supply lines; a first planarization layer on a side of the first metal layer distal to the base substrate; a first electrode layer on a side of the first planarization layer distal to the first metal layer and provided with a plurality of first electrodes spaced apart from each other; and a pixel defining layer on a side of the first electrode layer distal to the first planarization layer, and having a plurality of apertures which are in a one-to-one correspondence with the plurality of first electrodes and make the plurality of first electrodes exposed, the plurality of apertures being provided corresponding to sub pixels of at least two different colors, and wherein orthographic projections of the plurality of apertures corresponding to the sub pixels of at least two different colors on the base substrate each are divided by the orthographic projections of the plurality of first power supply lines on the base substrate into a first portion at a first side of one corresponding power supply line of the plurality of first power supply line and a second portion at a second side of the one corresponding first power supply line of the plurality of first power supply lines, and for the sub pixels of the at least two different colors, a first area ratio is a ratio between areas of the first portions of the orthographic projections of the apertures of the sub pixels of the at least two different colors on the base substrate, a second area ratio is a ratio between areas of the second portions of the orthographic projections of the apertures of the sub pixels of the at least two different colors on the base substrate, and a ratio between the first area ratio and the second area ratio is in a range from 0.8 to 1.2.

In some embodiments, the method further includes: adjusting widths of the first power supply lines at positions where the orthographic projections of the apertures of the sub pixels of the at least two different colors on the base substrate such that the ratio between the first area ratio and the second area ratio is in a range from 0.8 to 1.2.

In some embodiments, the method further includes adjusting widths of the first power supply lines at positions outside the positions where the orthographic projections of the apertures of the sub pixels of the at least two different colors on the base substrate while adjusting the widths of the first power supply lines at positions where the orthographic projections of the apertures of the sub pixels of the at least two different colors on the base substrate are located.

In some embodiments, the first power supply lines extend in a first direction, the first portion and the second portion are arranged in a second direction, the first direction crosses over the second direction, the sub pixels of the at least two different colors includes a red sub pixel (R), a blue sub pixel (B), and a green sub pixel (G), the plurality of first power supply lines include first sub power supply lines and second sub power supply lines which are arranged in parallel to each other and are alternately arranged along the first direction, and each of orthographic projections of apertures of the corresponding red sub pixel (R) and the corresponding blue sub pixel (B) is divided by an orthographic projection of the first sub power supply line on the base substrate into the first portion (R1, B1) and the second portion (R2, B2), and an orthographic projection of an aperture of the green sub pixel (G) is divided by an orthographic projection of the second sub power supply line on the base substrate into the first portion (G1) and the second portion (G2), the first sub power supply line includes a first repeating part and a second repeating part which are coupled to each other and are combined as a repeating unit, a central axis along the first direction of the first repeating part is distal to the second portion (R2, B2) of the orthogonal projection of the aperture of the corresponding red sub pixel (R) and the corresponding blue sub pixel (B) with respect to a central axis along the first direction of the second repeating part, the first repeating part is concave relative to the second repeating unit on a side proximal to the second portion (R2, B2) of the orthogonal projection of the aperture of the corresponding red sub pixel (R) and the corresponding blue sub pixel (B); and the orthographic projections of the red sub-pixel (R) and the blue sub pixel (B) on the base substrate overlap with the orthographic projections of the first repeating part and the second repeating part of a corresponding first sub power line on the substrate, respectively; the second sub power supply line includes a third repeating part, a fourth repeating part, and a fifth repeating part which are sequentially coupled to each other and are combined as a repeating unit; a central axis along the first direction of the third repeating part, a central axis along the first direction of the fourth repeating part and a central axis along the first direction of the fifth repeating part are sequentially approaching the second portion (G2) of the orthographic projection of the aperture of a corresponding green sub pixel (G), the third repeating part is concave relative to the fourth repeating unit at a side proximal to the second portion (G2) of the orthographic projection of the aperture of the corresponding green sub pixel (G), and the fifth repeating part is concave relative to the fourth repeating unit at a side distal to the second portion (G2) of the orthographic projection of the aperture of the corresponding green sub pixel (G), and the orthographic projection of the green sub pixel (G) on the base substrate overlaps with the orthographic projections of the fourth repeating part and the fifth repeating part of a corresponding second sub power supply line on the base substrate or overlaps with the orthographic projection of the fifth repeating part of the corresponding second sub power supply line on the base substrate.

In some embodiments, a line width of the first repeating part is 3.8 μm, a line width of the second repeating part is 5.7 μm, a line width of the third repeating part is 3.8 μm, a line width of the fourth repeating part is 6.7 μm, and a line width of the fifth repeating part is 3.0 μm.

BRIEF DESCRIPTION OF THE DRAWINGS

In order to more clearly illustrate the technical solutions of the embodiments of the present disclosure, the drawings to be used in the embodiments or in the related art will be briefly introduced below. It is obvious that the drawings in the following description merely relate to the embodiments of the present disclosure and are not intended to limit the present disclosure.

DETAILED DESCRIPTION

In order to make objects, technical solutions and advantages of the present disclosure more apparent, the technical solutions of the embodiments of the present disclosure will be described clearly and completely below with reference to the drawings of the embodiments of the present disclosure. It is to be apparent that the described embodiments are only some of the embodiments of the present disclosure, but not all the embodiments of the present disclosure. All other embodiments that can be derived without inventive effort by one of ordinary skill from the described embodiments of the present disclosure are within the protection scope of the present disclosure.

Unless otherwise defined, technical or scientific terms used herein shall have the ordinary meaning as understood by one of ordinary skill in the art to which the present disclosure belongs. Terms such as "first", "second", and the like used in the present disclosure is not intended to indicate any order, quantity, or importance, but rather is used for distinguishing between different elements. The words of "comprise" or "include", and the like, means that the element or item preceding the word contains the element or item listed after the word and its equivalents, but does not exclude the presence of other elements or items.

Figure 1A:
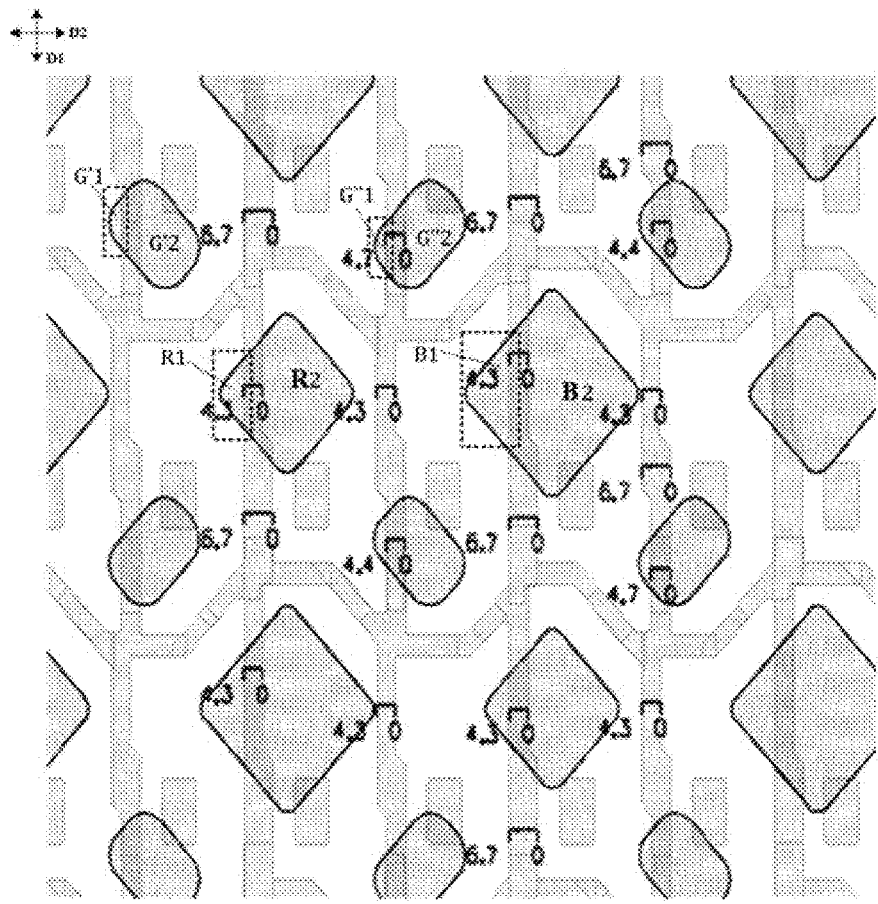
FIG. 1A is a schematic diagram illustrating a structure of a portion of a display substrate in the related art.
Figure 1B:
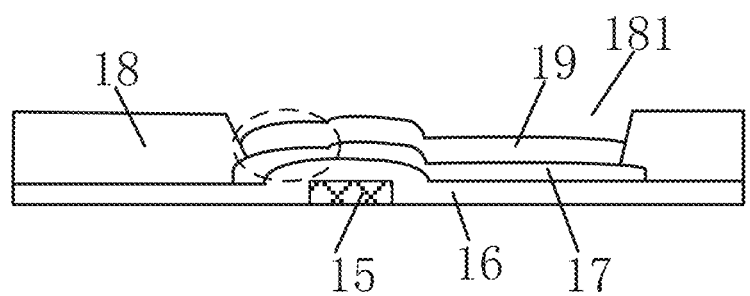
FIG. 1B is a schematic diagram illustrating warpage at an aperture of a display substrate.

FIG. 1A is a schematic diagram illustrating a structure of a portion of a display substrate in the related art, and FIG. 1B is a schematic diagram illustrating warpage at an aperture of a display substrate.

An aperture of a sub pixel and a power supply line below the aperture are shown in FIG. 1A. Since a planarization layer and a pixel defining layer are provided sequentially on the power supply line, an orthographic projection of the aperture in the pixel defining layer on the display substrate includes two portions divided by an orthographic projection of the power supply line on the display substrate. Due to the presence of the power supply line, a height difference between layers below the aperture may occur, which may cause warpage of an organic light emitting material in the aperture at one of the divided two portions (indicated by a dotted line) which has a smaller area, thereby resulting in occurrence of color shift.

FIG. 1B illustrates the warpage at the pixel aperture. As shown in FIG. 1B, a planarization layer 16 is provided on a power supply line 15, an anode 17 of a light emitting element is provided on the planarization layer 16, and a pixel defining layer 18 is provided on the anode 17. The pixel defining layer 18 has an aperture 181, and exposes the anode 17 from the aperture 181. An organic light emitting material layer 19 is on the anode 17 exposed from the aperture 181. Due to the presence of the power supply line 15, the anode 17 is warped, and thus the organic light emitting material layer 19 is warped, resulting in different light intensities of light emitting regions of sub pixels of different colors at two sides (e.g., a left side and a right side) of the orthographic projection of the power supply line 15.

FIG. 1A illustrates relationship of positions between power supply lines 15 and apertures 181. Among the apertures 181, four types of apertures G1 (a first green aperture), G2 (a second green aperture), R (a red aperture), and B (a blue aperture) are respectively used to form therein organic light emitting layers of corresponding colors. The organic light emitting layers of the four colors are used to form the sub pixels of the corresponding colors, and are repeatedly arranged as a repeating unit on a display panel.

As shown in FIG. 1A, an orthographic projection of each of the apertures 181 on the display substrate is divided into an left portion and an right portion, for example, an orthographic projection of each of the apertures 181 on the display substrate is divided into the left and right portions having different areas in a second direction D2, by an orthographic projection of a respective power supply line 15 on the display substrate, and the left portion has a smaller area than that of the right portion. The power supply line 15 has different widths at different positions along a first direction D1, for example, the power supply line 15 has a width of 6.7 μm at a first position and a width of 4.3 μm at a second position. The first direction D1 crosses over, e.g., is orthogonal to, the second direction D2. Due to the presence of the power supply line 15, a height difference of the layers below the aperture 181 may occur, which may cause the warpage of one of the two portions, divided by the orthographic projection of the power supply line 15 which has a smaller area, of the organic light emitting material 19 in the aperture 181, thereby resulting in the occurrence of the color shift, as shown in the dotted line of FIG. 1B. This may result in different light intensities of light emitting regions of the sub pixels of the different colors at the two sides (e.g., the left side and the right side) of the orthographic projection of the power supply line 15. A color shift at a large view angle, for example, a color shift that a red occurs at a side of a display device while a cyan at the other side of the display device when viewed with eyes, may occur in the display device adopting the above display substrate.

In the related art, a dual power supply line pixel structure is generally adopted, that is, in order to reduce a load of the power supply line, another layer of power supply line is generally superimposed on the power signal line. For example, the another layer of power supply line is above or below the power supply line 15, is spaced apart from the power supply line 15 by an insulating layer and is coupled to the power supply line 15 by vias in the insulating layer. The dual power supply line pixel structure is taken as an example in the present disclosure.

Therefore, according to an aspect of the present disclosure, a display substrate and a display device are provided. The display substrate includes: a base substrate; and a plurality of sub pixels on the base substrate. The plurality of sub pixels includes: a first metal layer on the base substrate, the first metal layer including a plurality of first power supply lines; a first planarization layer on a side of the first metal layer distal to the base substrate; a first electrode layer on a side of the first planarization layer distal to the first metal layer, the first electrode layer being provided with a plurality of first electrodes spaced apart from each other; and a pixel defining layer on a side of the first electrode layer distal to the first planarization layer, the pixel defining layer having a plurality of apertures in a one-to-one correspondence with the plurality of first electrodes and exposing the plurality of first electrodes from the apertures, the plurality of apertures being provided corresponding to sub pixels of at least two different colors. An orthographic projection of one of the plurality of first power supply lines on the base substrate divides an orthographic projection of a respective one of the plurality of apertures on the base substrate into a first portion at a first side of the first power supply line and a second portion at a second side of the first power supply line. A ratio of an area ratio between the first portions of the orthographic projections of the apertures corresponding to at least two sub pixels of different colors, to an area ratio between the second portions of the orthographic projections of the apertures corresponding to the sub pixels of the at least two different colors, is in a range from 0.8 to 1.2. The ratio range can prevent human eyes from distinguishing the color shift caused by different light mixing ratios at the two sides of the first power supply line, thereby alleviating the color shift of the display panel.

For convenience of understanding, as shown in FIG. 1A, the first power supply line extends along the direction D1, and the plurality of first power supply lines are arranged along the direction D2. Orthographic projections of a red sub pixel R, a blue sub pixel B and a green sub pixels G on the base substrate are divided by the first power supply line to include first portions R1, B1 and G1, and second portions R2, B2 and G2, respectively. The green sub pixel G may include a first green sub pixel G' and a second green sub pixel G", and the first green sub pixel G' and the second green sub pixel G" are also divided into the first portions G'1 and G"1, and the second portions G'2 and G"2 by the first power supply line, respectively. The two portions of each of the sub pixels divided by the orthographic projection of the first power supply line are arranged in the direction D2. The first portions G'1, G"1, R1, and B1 are at a first side of the first power supply line, and the second portions G'2, G"2, R2, and B2 are at a second side of the first power supply line.

The display substrate and the display device provided in the embodiments of the present disclosure will be described below with reference to the drawings.

Figure 3A:
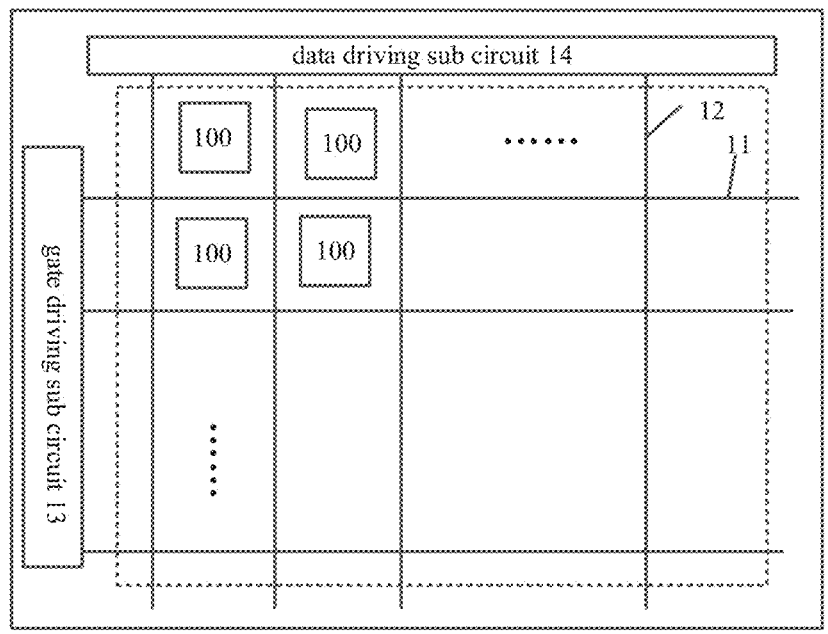
FIG. 3A is a schematic diagram illustrating a display substrate according to an embodiment of the present disclosure.

As shown in FIG. 3A, the display substrate 20 includes a plurality of sub pixels 100 arranged in an array, a plurality of gate lines 11, and a plurality of data lines 12. Each of the plurality of sub pixels 100 includes a light emitting element and a pixel circuit for driving the light emitting element. The plurality of gate lines 11 and the plurality of data lines 12 cross over each other to define a plurality of pixel regions arranged in an array in a display region, and a pixel circuit of one sub pixel 100 is provided in each of the plurality of pixel regions. The pixel circuit may be, for example, a conventional pixel circuit, such as an nTmC (n and m are positive integers) pixel circuit of 2T1C (i.e., two transistors and one capacitor), 4T2C, 5T1C, 7T1C, or the like. In various embodiments, the pixel circuit may further include a compensation sub circuit that includes an internal compensation sub circuit or an external compensation sub circuit. The compensation sub circuit may include transistors, capacitors, or the like. For example, the pixel circuit may further include a reset circuit, a light emitting control sub circuit, a detection circuit, or the like as desired. For example, the display substrate may further include a gate driving sub circuit 13 and a data driving sub circuit 14 in a non-display region. The gate driving sub circuit 13 is coupled to the pixel circuit through the gate line 11 for supplying various scan signals to the pixel circuit, and the data driving sub circuit 14 is coupled to the pixel circuit through the data line 12 for supplying a data signal to the pixel circuit. Relationship of positions of the gate driving sub circuit 13, the data driving sub circuit 14, the gate lines 11 and the data lines 12 on the display substrate as shown in FIG. 3A is merely an example, and the actual arrangement positions may be designed as desired.

For example, the display substrate 20 may further include a control circuit (not shown). For example, the control circuit is configured to control the data driving sub circuit 14 to output the data signal, and to control the gate driving sub circuit to output the scan signal. In an example, the control circuit may be a timing control circuit (T-con). The control circuit may be implemented in various forms, for example, the control circuit may include a processor and a storage device. The storage device may include executable codes, and the processor may execute the executable codes to perform display.

For example, the processor may be a central processing unit (CPU) or other form of processing device having data processing capabilities and/or instruction execution capabilities, and the processing device may include, for example, a microprocessor, a programmable logic controller (PLC), or the like.

For example, the storage device may include one or more computer program products that may include various forms of computer-readable storage media, such as a volatile memory and/or a non-volatile memory. The volatile memory may include, for example, a random access memory (RAM), and/or a cache memory (cache). The non-volatile memory may include, for example, a read only memory (ROM), a hard disk, a flash memory, or the like. One or more computer program instructions may be stored on the computer-readable storage medium that can direct a processor to function as desired. Various applications and various data may also be stored on the computer-readable storage medium.

Figure 3B:
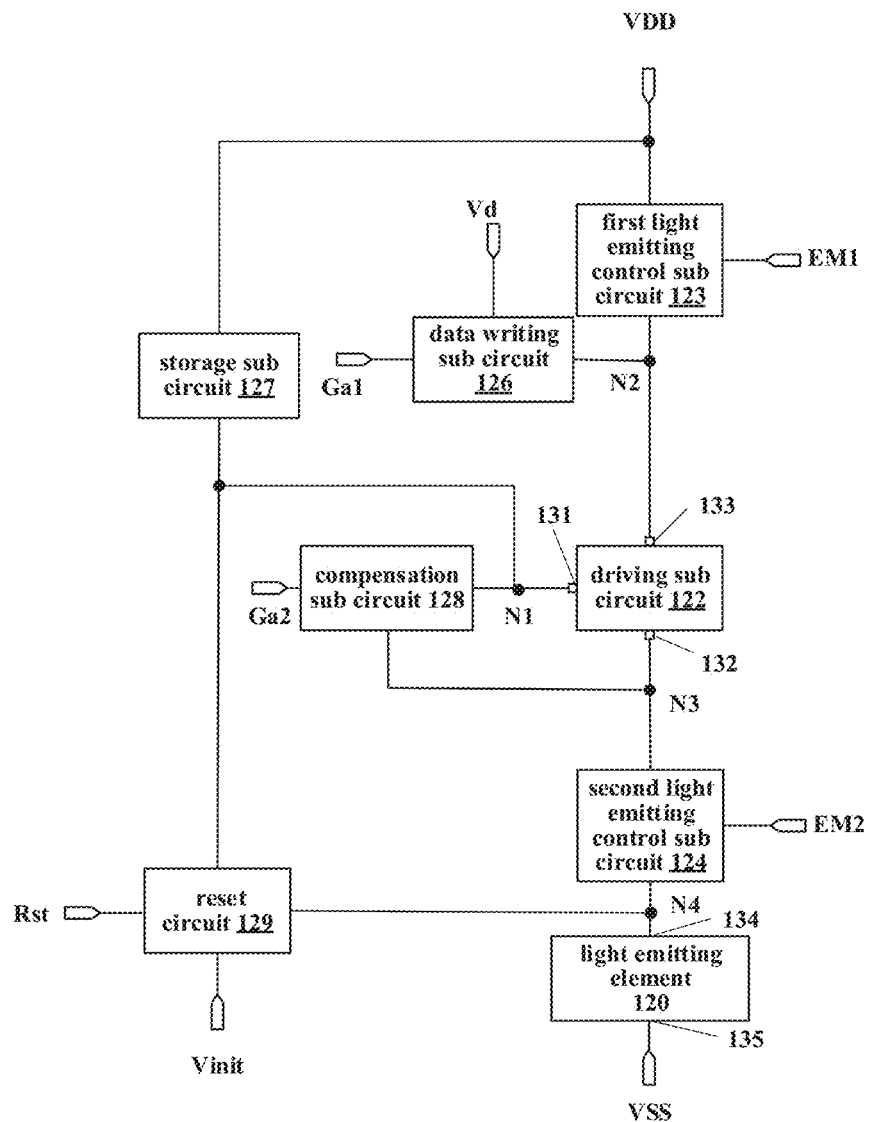
FIG. 3B is a schematic diagram illustrating modules of a pixel circuit of a display substrate according to an embodiment of the present disclosure.

The pixel circuit may include a driving sub circuit, a data writing sub circuit, a compensation sub circuit, and a storage sub circuit, and may further include a light emitting control sub circuit, a reset circuit, or the like as desired. FIG. 3B is a schematic diagram illustrating a pixel circuit.

As shown in FIG. 3B, the pixel circuit includes a driving sub circuit 122, a data writing sub circuit 126, a compensation sub circuit 128, a storage sub circuit 127, a first light emitting control sub circuit 123, a second light emitting control sub circuit 124, and a reset circuit 129.

For example, the driving sub circuit 122 may include a control terminal 131, a first terminal 132 and a second terminal 133, and may be configured to control a driving current flowing through the light emitting element 120. The control terminal 131 of the driving sub circuit 122 is coupled to a first node N1, the first terminal 132 of the driving sub circuit 122 is coupled to a second node N2, and the second terminal 133 of the driving sub circuit 122 is coupled to a third node N3.

For example, the data writing sub circuit 126 may include a control terminal configured to receive a first scan signal, a first terminal configured to receive a data signal, and a second terminal which is coupled to the first terminal 132 (the second node N2) of the driving sub circuit 122 and is configured to write the data signal into the first terminal 132 of the driving sub circuit 122 in response to the first scan signal Ga1. For example, the first terminal of the data writing sub circuit 126 is coupled to the data line 12 for receiving the data signal, and the control terminal of the data writing sub circuit 126 is coupled to the gate line 11 for receiving the first scan signal Ga1.

For example, in a data writing phase, the data writing sub circuit 126 may be turned on in response to the first scan signal Ga1, so that the data signal may be written into the first terminal 132 (the second node N2) of the driving sub circuit 122 and may be stored in the storage sub circuit 127, so as to generate the driving current for driving the light emitting element 120 to emit light according to the data signal in, for example, a light emitting phase.

For example, the compensation sub circuit 128 may include a control terminal configured to receive a second scan signal Ga2, a first terminal and a second terminal electrically coupled to the control terminal 131 and the second terminal 133 of the driving sub circuit 122 respectively. The compensation sub circuit 128 is configured to perform threshold compensation on the driving sub circuit 120 in response to the second scan signal.

For example, the storage sub circuit 127 is electrically coupled to the control terminal 131 of the driving sub circuit 122 and a first voltage terminal VDD, and is configured to store the data signal written by the data writing sub circuit 126. For example, in a data writing and compensation phase, the compensation sub circuit 128 may be turned on in response to the second scan signal Ga2, so that the data signal written by the data writing sub circuit 126 may be stored in the storage sub circuit 127. For example, in the data writing and compensation phase, the compensation sub circuit 128 may electrically couple the control terminal 131 of the driving sub circuit 122 to the second terminal 133 of the driving sub circuit 122, so that the information related to the threshold voltage of the driving sub circuit 122 may be correspondingly stored in the storage sub circuit, thereby controlling the driving sub circuit 122 by using the stored data signal and the threshold voltage and compensating the output of the driving sub circuit 122, for example, in the light emitting phase.

For example, the first light emitting control sub circuit 123 may be coupled to the first terminal 132 (the second node N2) of the driving sub circuit 122 and the first voltage terminal VDD, and may be configured to apply a first power voltage from the first voltage terminal VDD to the first terminal 132 of the driving sub circuit 122 in response to a first light emitting control signal. For example, as shown in FIG. 3B, the first light emitting control sub circuit 123 is coupled to a first light emitting control terminal EM1, the first voltage terminal VDD, and the second node N2.

For example, the second light emitting control sub circuit 124 is coupled to a second light emitting control terminal EM2, a first terminal 134 of the light emitting element 120, and the second terminal 133 of the driving sub circuit 122, and is configured such that the driving current may be applied to the light emitting element 120 in response to a second light emitting control signal.

For example, in the light emitting phase, the second light emitting control sub circuit 124 is turned on in response to the second light emitting control signal provided by the second light emitting control terminal EM2, so that the driving sub circuit 122 may be electrically coupled to the light emitting element 120 through the second light emitting control sub circuit 124, thereby driving the light emitting element 120 to emit light under the control of the driving current; in a non-light emitting phase, the second light emitting control sub circuit 124 is turned off in response to the second light emitting control signal, so as to prevent a current from flowing through the light emitting element 120 and to prevent the light emitting element 120 from emitting light, thereby enhancing contrast of the corresponding display device.

For another example, in an initialization phase, the second light emitting control sub circuit 124 may also be turned on in response to the second light emitting control signal, so that the second light emitting control sub circuit 124 may be combined with the reset circuit to perform reset operation on the driving sub circuit 122 and the light emitting element 120.

For example, the second light emitting control signal EM2 may be the same as or different from the first light emitting control signal EM1, e.g., both the first and second light emitting control signals may be provided by a same or different signal output terminal.

For example, the reset circuit 129 is coupled to a reset voltage terminal Vinit and the first terminal 134 (a fourth node N4) of the light emitting element 120, and is configured to apply a reset voltage to the first terminal 134 of the light emitting element 120 in response to a reset signal. In other examples, as shown in FIG. 3B, the reset signal may also be applied to the control terminal 131 of the driving sub circuit, i.e., the first node N1. For example, the reset signal may be the second scan signal, and the reset signal may be another signal synchronized with the second scan signal, which is not limited in the embodiments of the present disclosure. For example, as shown in FIG. 3B, the reset circuit 129 is coupled to the first terminal 134 of the light emitting element 120, the reset voltage terminal Vinit, and a reset control terminal Rst (a reset control line). For example, in the initialization phase, the reset circuit 129 may be turned on in response to the reset signal, so that the reset voltage may be applied to the first terminal 134 of the light emitting element 120 and the first node N1, thereby the driving sub circuit 122, the compensation sub circuit 128, and the light emitting element 120 may be reset and the influence of the previous light emitting phase may be eliminated.

For example, the light emitting element 120 includes a first terminal 134 and a second terminal 135, the first terminal 134 of the light emitting element 120 is configured to be coupled to the second terminal 133 of the driving sub circuit 122, and the second terminal 135 of the light emitting element 120 is configured to be coupled to a second voltage terminal VSS. For example, in an example, as shown in FIG. 3B, the first terminal 134 of the light emitting element 120 may be coupled to the third node N3 through the second light emitting control sub circuit 124. The embodiments of the present disclosure include, but are not limited to, the above scenario. For example, the light emitting element 120 may include various types of OLEDs, such as top-emitting type, bottom emitting type, double-sided emitting type, or the like, which may emit red light, green light, blue light, white light, or the like. A first electrode and a second electrode of the OLED may serve as the first and second terminal 134 and 135 of the light emitting element, respectively. The embodiments of the present disclosure do not limit a specific structure of the light emitting element.

It should be noted that, in the description of the embodiments of the present disclosure, the first node N1, the second node N2, the third node N3, and the fourth node N4 do not necessarily represent actually existing components, but represent junctions of relevant circuits in a circuit diagram.

It should be noted that, in the description of the embodiments of the present disclosure, the symbol Vd may represent both the data signal terminal and the level of the data signal. Similarly, the symbols Ga1 and Ga2 may represent both the first and second scan signal, and the first and second scan signal terminal; the symbol Rst may represent both the reset control terminal and the reset signal; the symbol Vinit may represent both the reset voltage terminal and the reset voltage; the symbol VDD may represent both the first voltage terminal and the first power voltage, and the symbol VSS may represent both the second voltage terminal and the second power voltage. The following embodiments are the same as the above and will not be repeated.

Figure 3C:
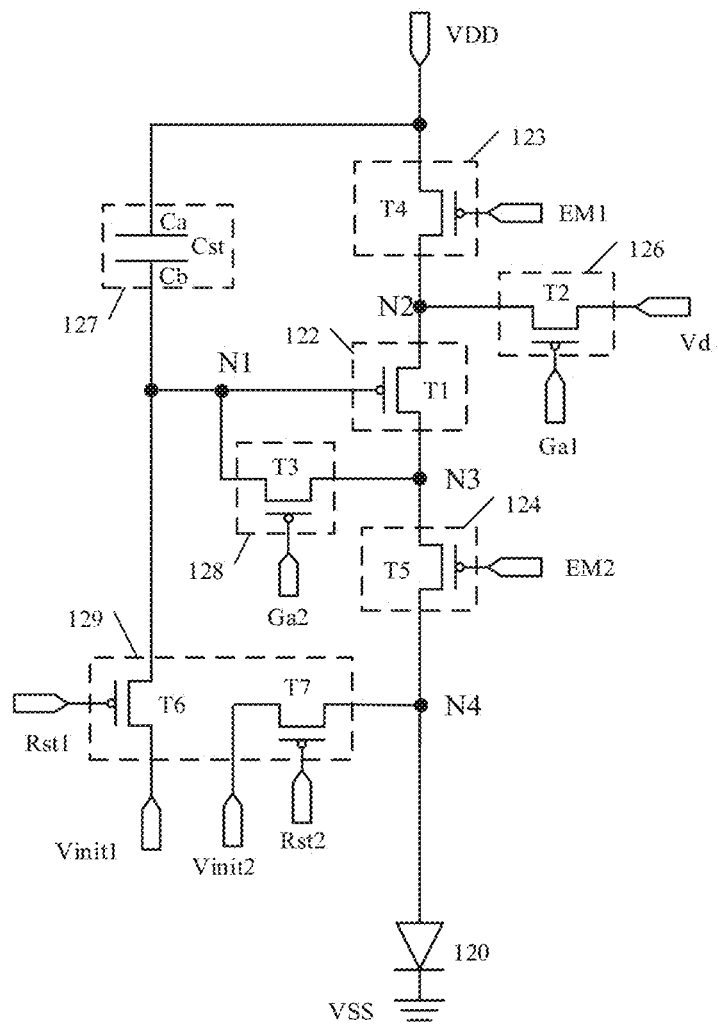
FIG. 3C is a schematic diagram illustrating a pixel circuit of a display substrate according to an embodiment of the present disclosure.

FIG. 3C is a circuit diagram of a specific example of the pixel circuit shown in FIG. 3B. As shown in FIG. 3C, the pixel circuit includes: the first to seventh transistors T1, T2, T3, T4, T5, T6, T7, and a storage capacitor Cst. For example, the first transistor T1 is used as a driving transistor, and the other second to seventh transistors are used as switching transistors.

For example, as shown in FIG. 3C, the driving sub circuit 122 may be implemented as the first transistor T1. A gate electrode of the first transistor T1 as the control terminal 131 of the driving sub circuit 122, is coupled to the first node N1; a first electrode of the first transistor T1 as the first terminal 132 of the driving sub circuit 122, is coupled to the first node N2; and a second electrode of the first transistor T1 as the second terminal 133 of the driving sub circuit 122, is coupled to the third node N3.

For example, as shown in FIG. 3C, the data writing sub circuit 126 may be implemented as the second transistor T2. A gate electrode of the second transistor T2 is coupled to the first scan line (the first scan signal terminal Ga1) for receiving the first scan signal, a first electrode of the second transistor T2 is coupled to the data line (the data signal terminal Vd) for receiving the data signal, and a second electrode of the second transistor T2 is coupled to the first terminal 132 (the second node N2) of the driving sub circuit 122. For example, the second transistor T2 may be a P-type transistor, such as a thin film transistor having an active layer formed by a low temperature doped polysilicon.

For example, as shown in FIG. 3C, the compensation sub circuit 128 may be implemented as the third transistor T3. A gate electrode of the third transistor T3 is coupled to the second scan line (the second scan signal terminal Ga2) to receive the second scan signal, a first electrode of the third transistor T3 is coupled to the control terminal 131 (the first node N1) of the driving sub circuit 122, and a second electrode of the third transistor T3 is coupled to the second terminal 133 (the third node N3) of the driving sub circuit 122.

For example, as shown in FIG. 3C, the storage sub circuit 127 may be implemented as the storage capacitor Cst. The storage capacitor Cst includes a first capacitor electrode Ca and a second capacitor electrode Cb. The first capacitor electrode Ca is coupled, e.g., electrically connected, to the first voltage terminal VDD, and the second capacitor electrode Cb is coupled, e.g., electrically connected, to the control terminal 131 of the driving sub circuit 122.

For example, as shown in FIG. 3C, the first light emitting control sub circuit 123 may be implemented as the fourth transistor T4. A gate electrode of the fourth transistor T4 is coupled to the first light emitting control line (the first light emitting control terminal EM1) for receiving the first light emitting control signal, a first electrode of the fourth transistor T4 is coupled to the first voltage terminal VDD for receiving the first power voltage, and a second electrode of the fourth transistor T4 is coupled to the first terminal 132 (the second node N2) of the driving sub circuit 122.

For example, the light emitting element 120 may be implemented as the OLED. A first pole 134 (an anode herein) of the light emitting element 120 is coupled to the fourth node N4 for receiving the driving current from the second terminal 133 of the driving sub circuit 122 through the second light emitting control sub circuit 124, and the second pole 135 (a cathode herein) of the light emitting element 120 is coupled to the second voltage terminal VSS for receiving the second power voltage. For example, the second voltage terminal may be grounded, i.e., VSS may be 0V.

For example, the second light emitting control sub circuit 124 may be implemented as the fifth transistor T5. A gate electrode of the fifth transistor T5 is coupled to the second light emitting control line (the second light emitting control terminal EM2) for receiving the second light emitting control signal, a first electrode of the fifth transistor T5 is coupled to the second terminal 133 (the third node N3) of the driving sub circuit 122, and a second electrode of the fifth transistor T5 is coupled to the first terminal 134 (the fourth node N4) of the light emitting element 120.

For example, the reset circuit 129 may include a first reset circuit configured to apply a first reset voltage Vini1 to the first node N1 in response to a first reset signal Rst1, and a second reset circuit configured to apply a second reset voltage Vini2 to the fourth node N4 in response to a second reset signal Rst2. For example, as shown in FIG. 3C, the first reset circuit is implemented as the sixth transistor T6, and the second reset circuit is implemented as the seventh transistor T7. A gate electrode of the sixth transistor T6 is coupled to the first reset control terminal Rst1 for receiving the first reset signal Rst1, a first electrode of the sixth transistor T6 is coupled to the first reset voltage terminal Vinit1 for receiving the first reset voltage Vinit1, and a second electrode of the sixth transistor T6 is coupled to the first node N1. A gate electrode of the seventh transistor T7 is coupled to the second reset control terminal Rst2 for receiving the second reset signal Rst2, a first electrode of the seventh transistor T7 is coupled to the second reset voltage terminal Vinit2 for receiving the second reset voltage Vinit2, and a second electrode of the seventh transistor T7 is coupled to the fourth node N4.

It should be noted that, all the transistors used in the embodiments of the present disclosure may be thin film transistors, field effect transistors, or other switching devices with the same characteristics as the thin film transistors or the field effect transistors, and all the embodiments of the present disclosure are described by taking the thin film transistors as examples. A source and drain electrode of the transistor used herein may be symmetrical in structure, so that there may be no difference in structure between the source electrode and the drain electrode. In the embodiments of the present disclosure, in order to distinguish two electrodes of the transistor except for a gate electrode, one of the two electrodes is directly described as a first electrode, and the other of the two electrodes is directly described as a second electrode.

Figure 2:
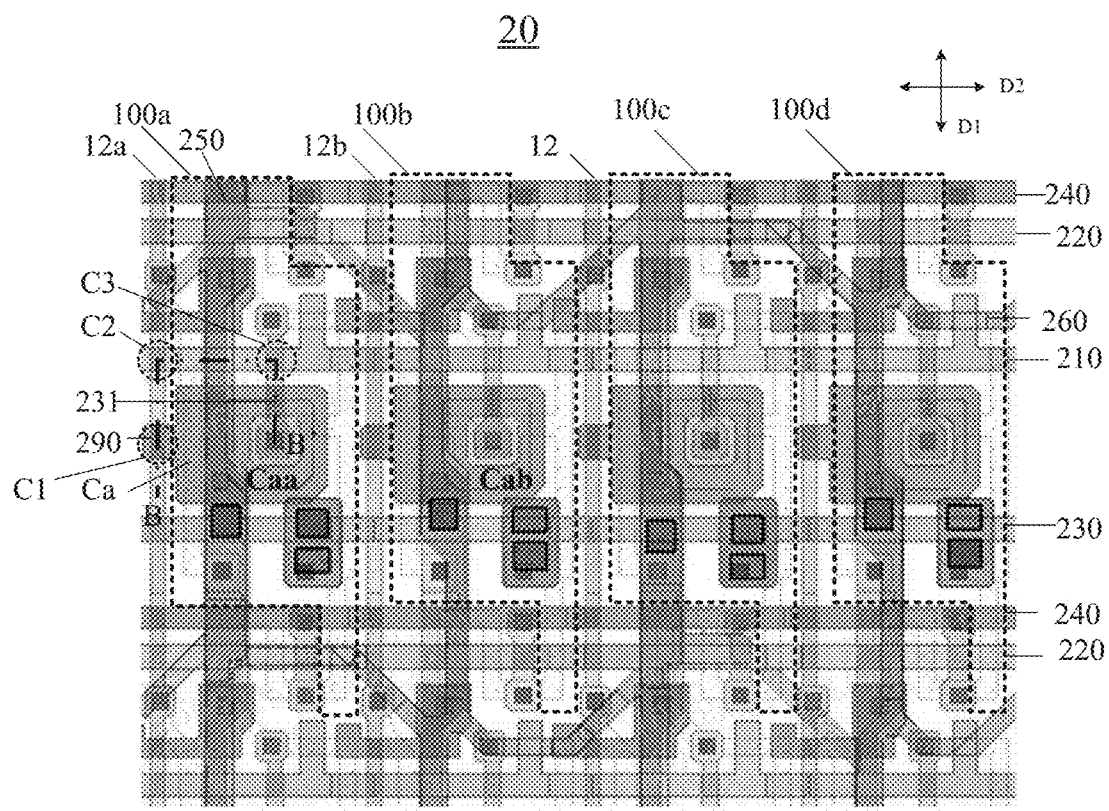
FIG. 2 is a schematic diagram illustrating a display substrate according to an embodiment of the present disclosure.

FIG. 2 is a schematic diagram illustrating a display substrate 20 according to an embodiment of the present disclosure. The display substrate 20 includes a base substrate 101, and a plurality of sub pixels 100 is provided on the base substrate 101. Pixel circuits of the plurality of sub pixels 100 are arranged as a pixel circuit array. A column direction of the pixel circuit array corresponds to the first direction D1, and a row direction of the pixel circuit array corresponds to the second direction D2. The first direction D1 crosses over, e.g., is orthogonal to, the second direction D2. In some embodiments, the first direction D1 may be a row direction, and the second direction D2 may be a column direction. In some embodiments, the pixel circuits of the plurality of sub pixels may have an identical structure except for a connection structure with the light emitting element, that is, the pixel circuits are repeatedly arranged in the row and column direction, and the connection structures of different sub pixels with the light emitting elements may be different according to shape and position of the poles of the light emitting structure of the plurality of sub pixels. In some embodiments, general frames of the pixel circuits of the sub pixels of different colors, such as the shape and position of respective signal lines, are substantially the same, and relative positional relationship of respective transistors is also substantially the same. However, a width and shape of some signal lines or some connecting lines, or a size and shape of channels of some transistors, or positions of connecting lines or vias for coupling to the light emitting elements of different sub pixels, may be different, which may be adjusted according to respective layout structures and the arrangement of the sub pixels. FIG. 2 illustrates four directly adjacent sub pixels (i.e., a first sub pixel 100a, a second sub pixel 100b, a third sub pixel 100c, and a fourth sub pixel 100d) in one row of sub pixels, and the embodiments of the present disclosure are not limited to the above layout.

Figure 4A:
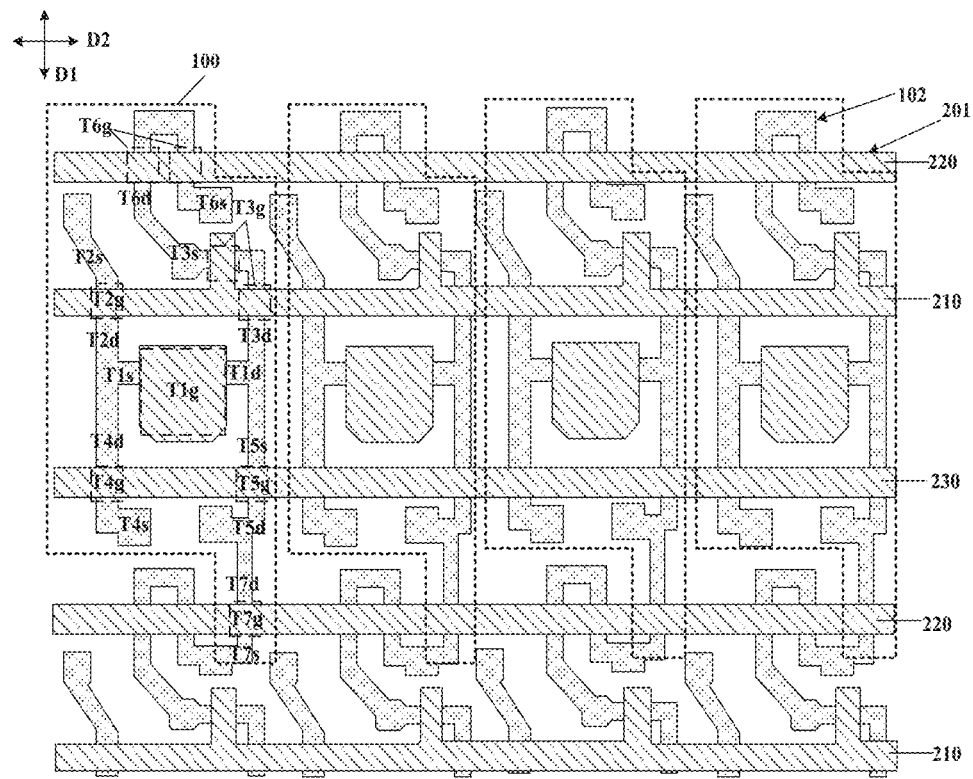
FIGS. 4A to 4D are schematic diagrams illustrating layers of a pixel circuit according to an embodiment of the present disclosure.
Figure 4B:
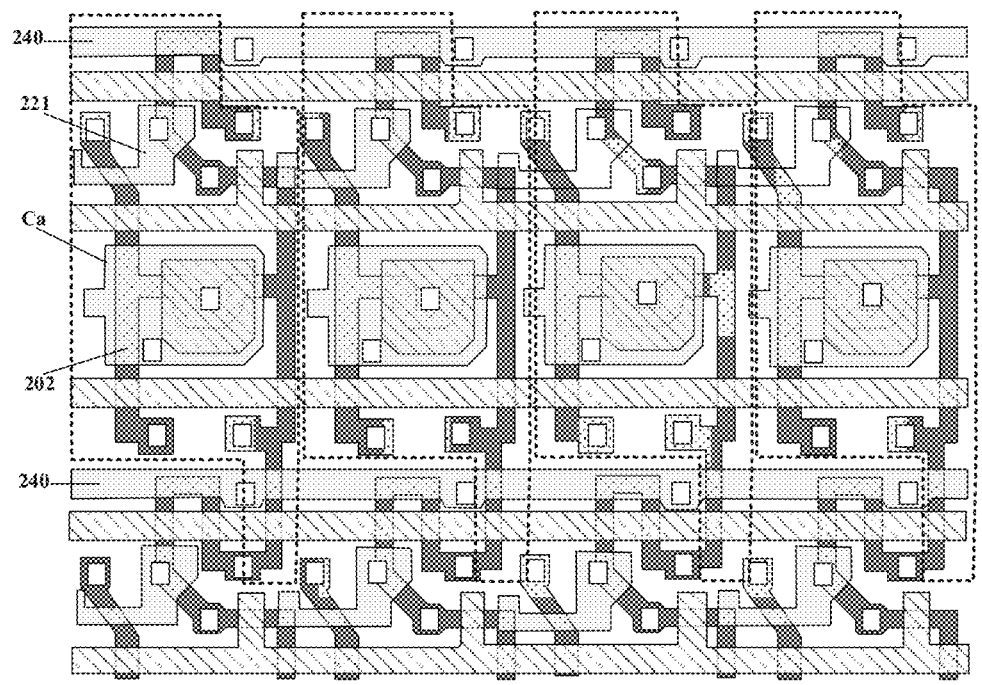
Figure 4C:
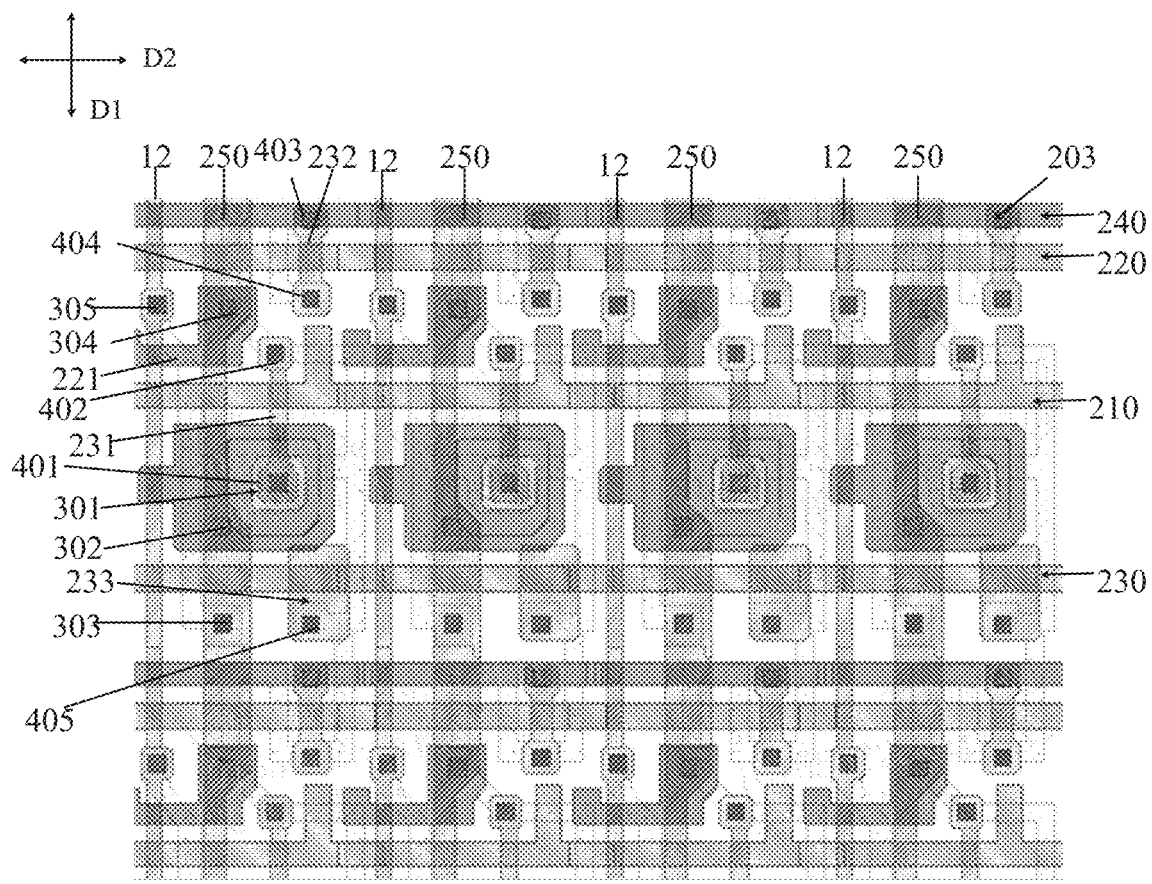
Figure 4D:
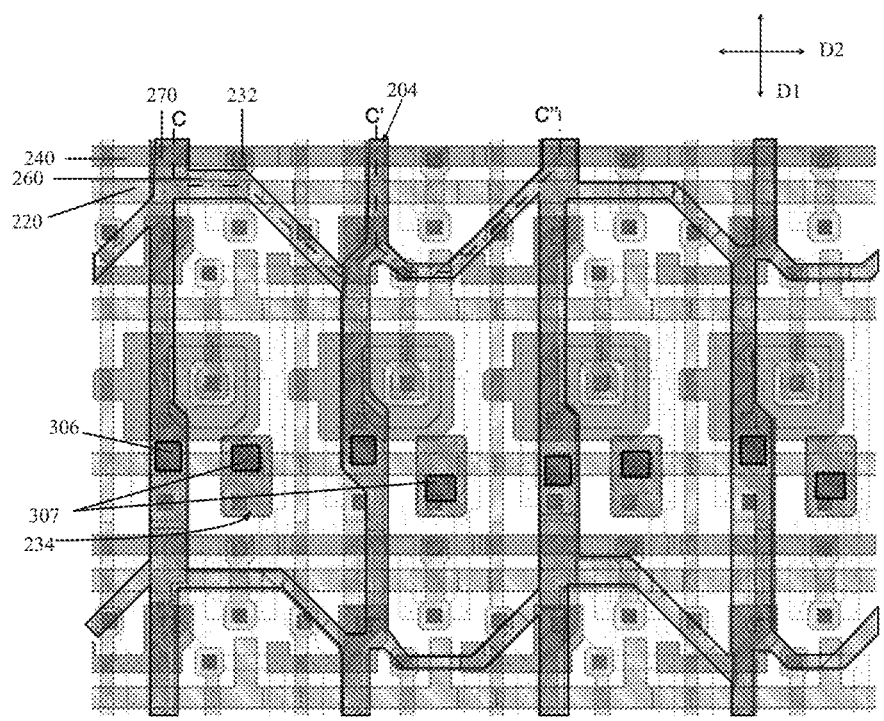

FIG. 4A illustrates a semiconductor layer 102 and a first conductive layer (a gate layer) 201 of the transistors T1 to T7 in the four sub pixels 100 as shown in FIG. 2, FIG. 4B further illustrates a second conductive layer 202 added in FIG. 4A, FIG. 4C further illustrates a third conductive layer 203 added in FIG. 4B, and FIG. 4D further illustrates a fourth conductive layer 204 added in FIG. 4C. It should be noted that the corresponding structures of adjacent four sub pixels in one row of sub pixels are merely schematically illustrated in the drawings, but the present disclosure is not limited thereto. The semiconductor layer 102, the first conductive layer 201, the second conductive layer 202, the third conductive layer 203, and the fourth conductive layer 204 are sequentially provided on the base substrate 101, thereby forming the display substrate as shown in FIG. 2.

For convenience of explanation, a gate electrode, a first electrode, a second electrode, and an active layer of an (n)th transistor Tn are denoted respectively by Tng, Tns, Tnd, and Tna, in the following description, where n denotes any one of 1 to 7.

It should be noted that, the term "in a same layer" in the present disclosure refers to a structure formed by two (or more than two) structures formed by a same deposition process and by being patterned by a same patterning process, and the materials of the two (or more than two) structures may be the same or different. The term "a structure as a single piece" in the present disclosure refers to structures coupled to each other formed by two (or more than two) structures formed by a same deposition process and by being patterned by a same patterning process, and the materials of the two (or more than two) structures may be the same or different.

For example, as shown in FIG. 4A, the first conductive layer 201 includes the gate electrode of each of the transistors and some scan lines and control lines. In FIG. 4A, the region where each of the sub pixels 100 is located is shown in a larger dotted-line, and the gate electrodes T1g to T7g of the first to seventh transistors T1 to T7 in one sub pixel 100 are shown in a smaller dotted-line.

The semiconductor layer 102 includes active layers T1a to T7a of the first to seventh transistors T1 to T7. As shown in FIG. 4A, the active layers T1a to T7a of the first to seventh transistors T1 to T7 are coupled to each other to form an a structure as a single piece. For example, the semiconductor layers 20 in each column of sub pixels are coupled to each other to form a structure as a single piece, and the semiconductor layers in two adjacent columns of sub pixels are spaced from each other.

For example, as shown in FIG. 4A, the first conductive layer 201 includes gate electrodes T1g-T7g of the first to seventh transistors T1-T7. For example, the third transistor T3 and the sixth transistor T6 have a double-gate structure, which can enhance the gate control capability of the transistors and reduce a leakage current.

For example, the first conductive layer 201 further includes a plurality of scan lines 210, a plurality of reset control lines 220, and a plurality of light emitting control lines 230 insulated from each other. For example, the sub pixels in a row are coupled to a same scan line 210, a same reset control line 220, and a same light emitting control line 230 respectively.

The scan line 210 is electrically coupled to (or is formed in an integral structure as a single piece with) the gate electrodes of the second transistors T2 in a respective row of sub pixels to provide the first scan signal Ga1, the reset control line 220 is electrically coupled to the gate electrodes of the sixth transistors T6 in a respective row of sub pixels to provide the first reset signal Rst1, and the light emitting control line 230 is electrically coupled to the gate electrodes of the fourth transistors T4 in a respective row of sub pixels to provide a first light emitting control signal EM1.

For example, as shown in FIG. 4A, the scan line 210 is further electrically coupled to the gate electrode of the third transistor T3 to provide the second scan signal Ga2, i.e., the first scan signal Ga1 and the second scan signal Ga2 may be the same signal. The light emitting control line 230 is further electrically coupled to the gate electrode of the fifth transistor T5 to provide the second light emitting control signal EM2, that is, the first light emitting control signal EM1 and the second light emitting control signal EM2 are the same signal.

For example, as shown in FIG. 4A, the gate electrodes of the seventh transistors T7 of the pixel circuits in the present row is electrically coupled to the reset control line 220 corresponding to the pixel circuits in the next row (i.e., a row of pixel circuits where a gate line, which is sequentially turned on in a scanning order after the gate line in the present row, is located) to receive the second reset signal Rst2.

For example, as shown in FIG. 4A, the gate line 11 for dividing the pixel region in the column direction (the first direction D1) may be implemented as the reset control line 220 or the light emitting control line 230. A portion of each of the reset control line 220, the light emitting control line 230, and the scan line 210 is included in each pixel circuit region.

For example, as shown in FIG. 4A, in the display substrate 20, a conductive treatment (e.g., a doping treatment) is performed on the semiconductor layer 102 by using the first conductive layer 201 as a mask (i.e., a self-aligned process), so that a portion of the semiconductor layer 102 not covered by the first conductive layer 201 is made conductive, for example, the portions of the active layer of each of the transistors on both sides of the channel region are made conductive to form the first electrode and the second electrode of the transistor, respectively.

For example, as shown in FIG. 4B, the second conductive layer 202 includes the first capacitor electrode Ca. The first capacitor electrode Ca overlaps with the gate electrode T1g of the first transistor T1 in a direction perpendicular to the base substrate 101 to form the storage capacitor Cst, i.e., the gate electrode T1g of the first transistor T1 serves as the second capacitor electrode Cb of the storage capacitor Cst. For example, the first capacitor electrode Ca includes a via 301, and the via 301 exposes at least a portion of the gate electrode T1g of the first transistor T1, so that the gate electrode T1g may be electrically coupled to other structures.

For example, the second conductive layer 202 may further include a plurality of reset voltage lines 240. The plurality of reset voltage lines 240 are coupled to the plurality of rows of sub pixels in a one-to-one correspondence. One of the plurality of reset voltage lines 240 is electrically coupled to the first electrodes of the sixth transistors T6 in a respective row of sub pixels to supply the first reset voltage Vinit1.

For example, as shown in FIG. 4B, the first electrodes of the seventh transistors T7 of the sub pixels in the current row are electrically coupled to the reset voltage line 240 in the next row of sub pixels to receive the second reset voltage Vinit2.

For example, as shown in FIG. 4B, the second conductive layer 202 may further include a shielding electrode 221, and the shielding electrode 221 overlaps with the first electrode T2s of the second transistor T2 in the direction perpendicular to the base substrate 101, so that a signal on the first electrode T2s of the second transistor T2 may be protected from other signals. Since the first electrode T2s of the second transistor T2 is used to receive the data signal Vd which determines the gray level of the sub pixel, the shielding electrode 221 can enhance the stability of the data signal, thereby enhancing the display quanlity.

For example, as shown in FIG. 4C, the third conductive layer 203 includes a plurality of second power supply lines 250 extending along the first direction D1 (the plurality of second power supply lines 250 correspond to a second metal layer). For example, the plurality of second power supply lines 250 is electrically coupled to a plurality of columns of sub pixels in a one-to-one correspondence to supply the first power voltage VDD. The second power supply line 250 is electrically coupled to the first capacitor electrode Ca in the respective column of sub pixels through a via 302, and is electrically coupled to the first electrode of the fourth transistor T4 through a via 303. For example, the second power supply line 250 is also electrically coupled to the shielding electrode 221 through a via 304, so that the shielding electrode 221 is at a fixed potential, which improves the shielding capability of the shielding electrode.

For example, the third conductive layer 203 further includes a plurality of data lines 12. The plurality of data lines 12 is electrically coupled to a plurality of columns of sub pixels in a one-to-one correspondence to provide the data signal. For example, each of the plurality of data lines 12 is electrically coupled to the first electrodes T2s of the second transistors T2 in the respective column of sub pixels through a via 305 to provide the data signal.

In consideration of uniformity and reliability of the process margin, the vias are arranged typically in the row and column direction. The via 304 and the via 305 are substantially located on the same straight line in the row direction, and the via 304 is located at a side of the via 305 distal to the data line 12. The via 305 is used to connect the data line 12 and the first electrodes T2s of the second transistors T2. For example, the via 305 is located at a position where the data line overlaps with the first electrode T2s of the second transistor T2 (e.g., an end of the first electrode T2s of the second transistor T2, i.e., an end of the semiconductor layer 102 on the left side), and the via 304 is located at a position where the second power supply line 250 covers.

In some embodiments, the data line 12 is located at the left side of the second power supply line 250 and extends in the column direction with the second power supply line 250. The first shielding electrode 221 extends downward by a distance from a position where the via 304 is covered by the first shielding electrode 221, extends to the left at a position not exceeding out of the scan line and covers a portion of the first electrode T2s of the second transistor T2. The first shielding electrode 221 is a left and right mirror image pattern of an approximately L-shape. In the embodiment, the left side refers to a side where the data line is located relative to the second power supply line, for example, a boundary of a region of one pixel circuit divided in the row direction is approximately a data line coupled to the one pixel circuit and a data line coupled to a next (for example, right adjacent) pixel circuit in the same row, that is, a portion between two adjacent data lines and the data line coupled to the one pixel circuit form a range where the one pixel circuit is located in the row direction. In other embodiments, the second power supply line or the reset signal line or the like may be designed as a boundary of the pixel circuit as desired.

For example, as shown in FIG. 4C, the third conductive layer 203 further includes a first connection electrode 231, one end of the first connection electrode 231 is electrically coupled to the gate electrode T1g of the first transistor T1, i.e., the second capacitor electrode Cb, through the via 301 in the first capacitor electrode Ca and the via 401 in the insulating layer, and the other end of the first connection electrode 231 is electrically coupled to the first electrode of the third transistor T3 through the via 402, thereby electrically connecting the second capacitor electrode Cb to the first electrode T3s of the third transistor T3. For example, the via 401 penetrates through the second insulating layer 104 and the third insulating layer 105, and the via 402 penetrates through the first insulating layer 103, the second insulating layer 104, and the third insulating layer 105 (referring to FIG. 6).

For example, as shown in FIG. 4C, the third conductive layer 203 further includes a second connection electrode 232, one end of the second connection electrode 232 is electrically coupled to a reset voltage line through a via 403, and the other end of the second connection electrode 232 is electrically coupled to the sixth transistor T6 through a via 404, so that the first electrode T6s of the sixth transistor T6 may receive the first reset voltage Vinit1 from the reset voltage line 240. For example, the via 403 penetrates through the third insulating layer 105, and the via 404 penetrates through the first insulating layer 103, the second insulating layer 104, and the third insulating layer 105 (referring to FIG. 6).

For example, as shown in FIG. 4C, the third conductive layer 203 further includes a third connection electrode 233. The third connection electrode 233 is electrically coupled to the second electrode T5d of the fifth transistor T5 through a via 405, so as to electrically connect the second electrode T5d of the fifth transistor T5 to the first electrode 134 of the light emitting element. For example, the via 405 penetrates through the first insulating layer 103, the second insulating layer 104, and the third insulating layer 105 (referring to FIG. 6), which will be described in detail below.

For example, as shown in FIG. 4D, the fourth conductive layer 204 includes a third power supply line 260. The third power supply line 260 extends along the second direction D2 and is electrically coupled to the plurality of second power supply lines 250, so as to form a mesh-shaped power supply line structure. This structure contributes to reduce the resistance on the power supply line and thus the voltage drop on the power supply line, and to uniformly supply the first power voltage to the respective sub pixels of the display substrate.

For example, the fourth conductive layer 204 further includes a plurality of first power supply lines 270 (the plurality of first power supply lines 270 correspond to a first metal layer). The plurality of first power supply lines 270 extend along the first direction D1 and are electrically coupled to the plurality of second power supply lines 250 in a one-to-one correspondence. As shown in FIG. 4D, the first power supply line 270 and the respective second power supply line 250 at least partially overlap with each other in a direction perpendicular to the base substrate 101 and are electrically coupled to each other through the via 306. For example, each of the sub pixels has one via 306, so that each of the first power supply lines 270 is coupled to the respective second power supply line 250 in parallel, which contributes to reduce the resistance of the power supply lines. In some embodiments, the second power supply line 250 in the third conductive layer may be widened or narrowed in line width at some positions in order to avoid certain structures such as a via or a connection line, or to make flatness of an upper layer structure. In some embodiments, the first power supply line 270 in the fourth conductive layer may also be widened or narrowed in line width at some positions in order to avoid certain structures such as a via or a connection line, or to make flatness of an upper layer structure. Thus, the first power supply line 270 and the respective second power supply line 250 may not completely overlap with each other in a direction perpendicular to the base substrate 101.

For example, the third power supply lines 260 and the first power supply lines 270 are electrically coupled to each other or are formed integrally as a single piece, so that the second power supply lines 250, the third power supply lines 260 and the first power supply lines 270 are formed in a mesh-shaped power supply line structure.

Figure 5:
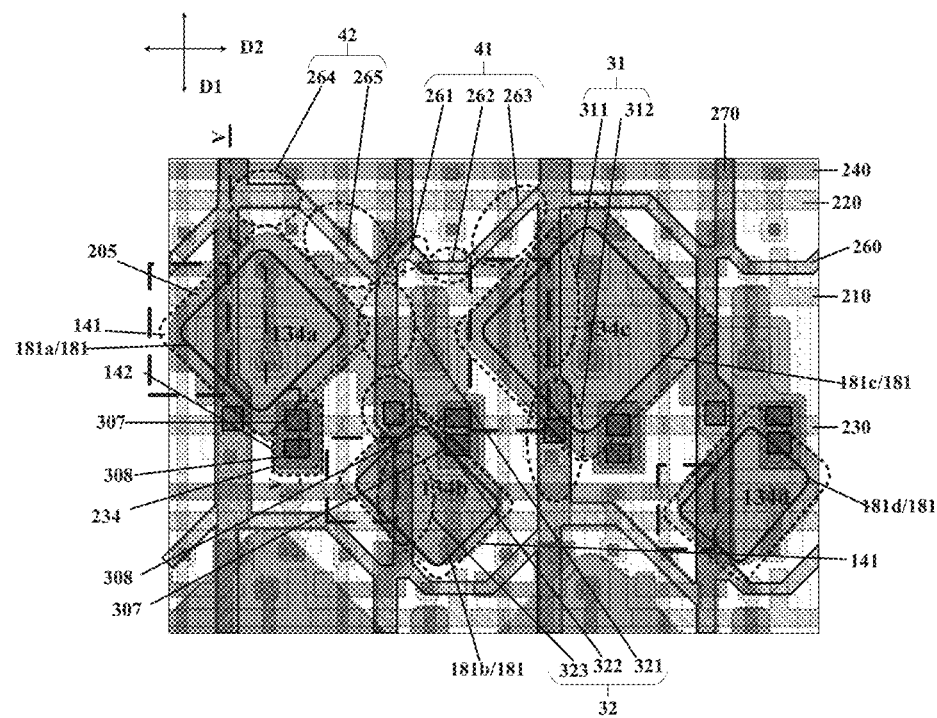
FIG. 5 is a schematic diagram illustrating a display device according to an embodiment of the present disclosure.

As shown in FIG. 5, the first power supply line 270 extends along the first direction D1, and the first and second portions of the orthographic projection of the aperture of each sub pixel are arranged along the second direction D2. The first direction D1 and the second direction D2 perpendicularly cross over each other. The plurality of first power supply lines 270 include a first sub power supply line 31 and a second sub power supply lines 32 alternately arranged in parallel with each other. The orthogonal projection of the apertures of the red and blue sub pixels on the base substrate 101 is divided respectively into a first portion and a second portion by the orthogonal projection of the first sub power supply lines 31 on the substrate 101. The orthographic projection of the aperture of the green sub pixel on the base substrate is divided into a first portion and a second portion by the orthographic projection of the second sub power supply line 32 on the base substrate 101.

As shown in FIG. 5, the first sub power supply line 31 includes a first repeating part 311 and a second repeating part 312 which are regarded as to a repeating unit connected one by one. A central axis of the first repeating part 311 is distal to the second portions of the orthographic projections of the apertures of the red and blue sub pixels on the base substrate with respect to a central axis of the second repeating part 312. The first repeating part 311 is hollowed (concave or recessed) and retracted on a side proximal to the second portions of the orthographic projections of the apertures of the red and blue sub pixels on the base substrate. The red sub pixel and the blue sub pixel overlap with the first repeating part 311 and the second repeating part 312 of the respective first sub power supply line 31, respectively.

As shown in FIG. 5, the second sub power supply line 32 includes a third repeating part 321, a fourth repeating part 322, and a fifth repeating part 323 which are regarded as a repeated unit connected one by one. A central axis of the third repeating part 321, a central axis of the fourth repeating part 322 and a central axis of the fifth repeating part 323 are sequentially close to the second portion of the orthographic projection of the aperture of the green sub pixel on the substrate. The third repeating part 321 is hollowed at a side close to the second portion of the orthographical project of the aperture of the green sub pixel on the base substrate, and the fifth repeating part 323 is hollowed at a side close to the first portion of the orthographical project of the aperture of the green sub pixel on the base substrate. The green sub pixel overlaps with the fourth and fifth repeating parts 322 and 323 of the respective second sub power supply line 32, respectively.

For example, the fourth conductive layer 204 further includes a fourth connection electrode 234 insulated from the first power supply line 270. The fourth connection electrode 234 is electrically coupled to the third connection electrode 233 through a via 307 to electrically connect the second electrode T5d of the fifth transistor T5 to the first pole 134 of the light emitting element. For example, the fourth connection electrode 234 and the third connection electrode 233 at least partially overlap with each other in a direction perpendicular to the base substrate 101.

Figure 6:
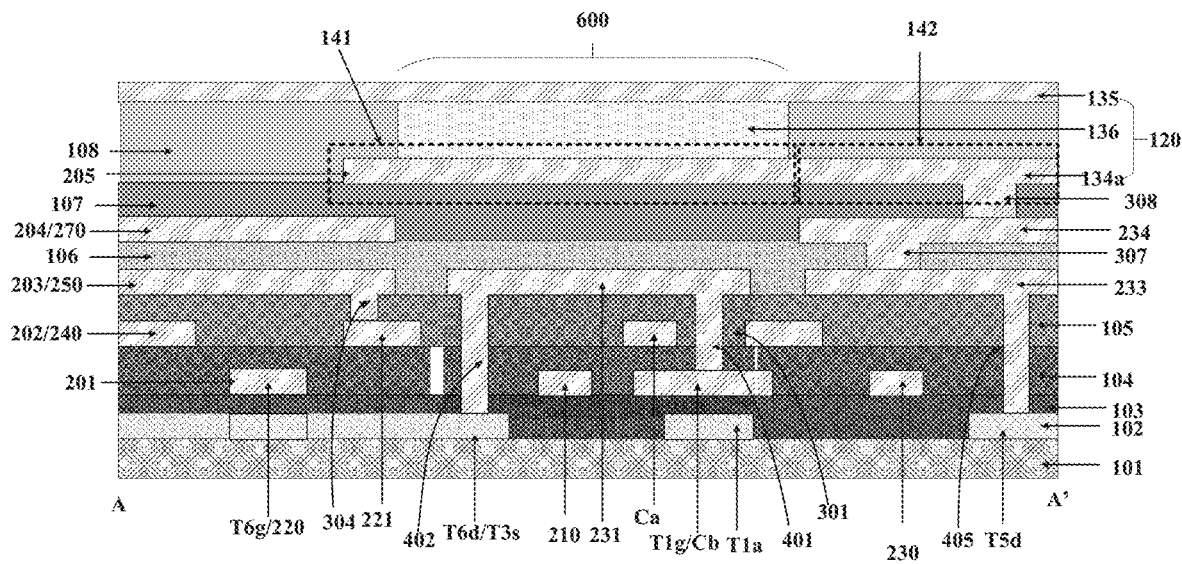
FIG. 6 is a cross-sectional view along a line A-A' in FIG. 5.

FIG. 5 further illustrates a fifth conductive layer 205 added in FIG. 4D. The fifth conductive layer 205 includes the first pole 134 of the light emitting element 120. FIG. 6 illustrates a cross-sectional view along a line A-A' in FIG. 5.

As shown in FIG. 6, the semiconductor layer 102, the first insulating layer 103, the first conductive layer 201, the second insulating layer 104, the second conductive layer 202, the third insulating layer 105, the third conductive layer 203, the fourth insulating layer 106, the fourth conductive layer 204, the fifth insulating layer 107, and the fifth conductive layer 205 are sequentially provided on the base substrate 101, so as to form the structure of the display substrate as shown in FIG. 5.

As shown in FIG. 5 and FIG. 6, the first electrode 134 may include a main body part 141 and a connection part 142. The main body part 141 is mainly used for driving the light emitting layer to emit light, and an orthogonal projection of the main body part 141 on the base substrate 101 covers an orthogonal projection of an aperture region 600 of the sub pixel to which the first electrode belongs on the base substrate. The connection part 142 is mainly used for coupling to the pixel circuit. As shown in FIG. 5, the third power supply line 260 does not overlap with each first electrode 134 in a direction perpendicular to the base substrate 101. The arrangement can prevent display problems such as color shift due to unevenness caused by the overlap of the first electrode 134 of the light emitting element with the third power supply line 260. A pixel defining layer is formed on the first electrode 134. An aperture region 600 is formed in the pixel defining layer. The aperture region 600 exposes at least a portion of the main body part 141 of the first electrode 134 and defines a light emitting region (aperture region) of each corresponding sub pixel. The light emitting layer of the light emitting element 120 is formed at least in the aperture region of the pixel defining layer. The flatness of the first electrode 134 directly affects the uniformity of the light emitted from the light emitting layer, thereby affecting the display quality. For example, the third power supply line 260 may have a curved shape, such as a polygonal line shape or a wavy line shape, to match the pattern of the first electrode 134. For example, a region where a row of sub pixels 100 is located is defined by adjacent two third power supply lines 260.

For example, as shown in FIG. 5, each of the plurality of third power supply lines 260 includes a third sub power supply line 41 and a fourth sub power supply line 42 which are sequentially connected as a repeating unit.

Figure 5A:
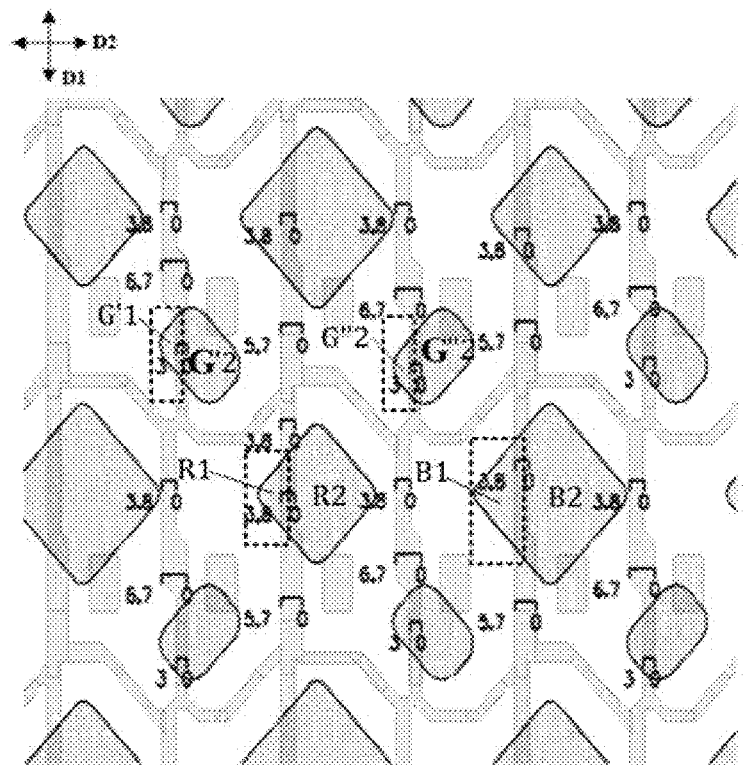
FIG. 5A is a schematic diagram illustrating a portion of a display device according to an embodiment of the present disclosure.

The third sub power supply line 41 includes a sixth repeating part 261, a seventh repeating part 262, and an eighth repeating part 263 which are sequentially connected as a repeating unit. The seventh repeating part 262 extends in a direction in parallel to the second direction D2, the sixth repeating part 261 extends in a direction crossing over both the first direction D1 and the second direction D2, and the eighth repeating part 263 extends in a direction which crosses over both the first direction D1 and the second direction D2 and is different from the direction in which the sixth repeating part 261 extends. As shown in FIG. 5A, the green sub pixels G are alternately arranged along the first direction, and the third sub power supply line 41 is between the orthogonal projections of the second portions G2 (including the second portion G'2 of the orthogonal projection of the aperture of the first green sub pixel G' and the second portion G"2 of the orthogonal projection of the aperture of the second green sub pixel G") of the green sub pixels G (including the first green sub pixel G' and the second green sub pixel G") on the base substrate. As shown in the sub pixel 100a in FIG. 2, the third sub power supply line 41 is located in a region between the second side of the orthogonal projection of the aperture of the green sub pixel on the base substrate and the first side of the orthogonal projection of the aperture of the adjacent red or blue sub pixel on the base substrate.

The fourth sub power supply line 42 includes a ninth repeating part 264 and a tenth repeating part 265. The ninth repeating part 264 extends in a direction parallel to the second direction, and the tenth repeating part 265 extends in a direction crossing over both the first direction and the second direction. As shown in FIG. 5A, the red sub pixel R and the blue sub pixel B are alternately arranged in the first direction respectively, and the fourth sub power supply line is between the orthogonal projection of the second portion R2 of the red sub pixel R and the orthogonal projection of the second portion B2 of the blue sub pixel B on the base substrate. As shown in the sub pixel 100b in FIG. 2, the fourth sub power supply line 42 is in a region between the second side of the aperture of the red or blue sub pixel on the base substrate and the first side of the aperture of adjacent green sub pixel on the base substrate.

The principle of arranging the third power supply line is to maintain a maximum overlapping area with the semiconductor layer pattern so as to increase an aperture ratio. For example, the main body part 141 of the first electrode 134 has a shape of a quadrangle, for example, each ninth repeating part 264 is arranged corresponding to one vertex angle of the main body part 141 of one first electrode 134, the ninth repeating part 264 overlaps with the portion of the semiconductor layer 102 along the first direction D1 to the maximum extent, and the adjacent tenth repeating part 265 overlaps with the portion of the semiconductor layer other than the first direction D1 and the second direction D2. Similarly, the sixth repeating part 261, the seventh repeating part 262, and the eighth repeating part 263 of the third power supply line, and the respective portions of the first power supply lines 270 and the second power supply line 250 are also arranged along the extending direction of the pattern of the semiconductor layer 102.

Figure 4E:
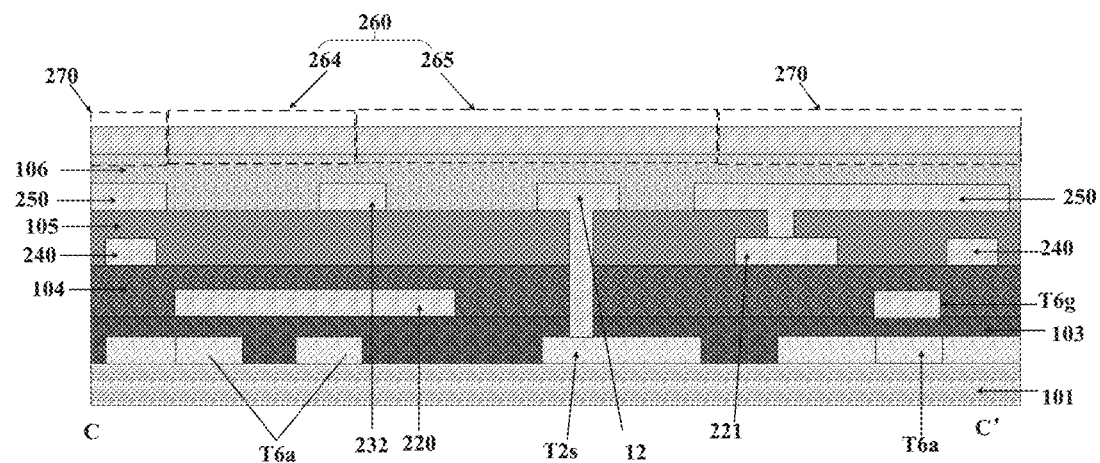
FIG. 4E is a cross-sectional view along a line C-C' in FIG. 4D.

FIG. 4E illustrates a cross-sectional view along a line C-C in FIG. 4D. As shown in FIG. 4E, the ninth repeating part 264 of the third power supply line 260 overlaps with the reset control line 220 in the direction perpendicular to the base substrate 101; the tenth repeating part 265 overlaps with one of the data lines 12 in the direction perpendicular to the base substrate 101; and the data line 12 is electrically coupled to a column of pixel circuits corresponding to the tenth repeating part 265 to provide the data signal.

Figure 4F:
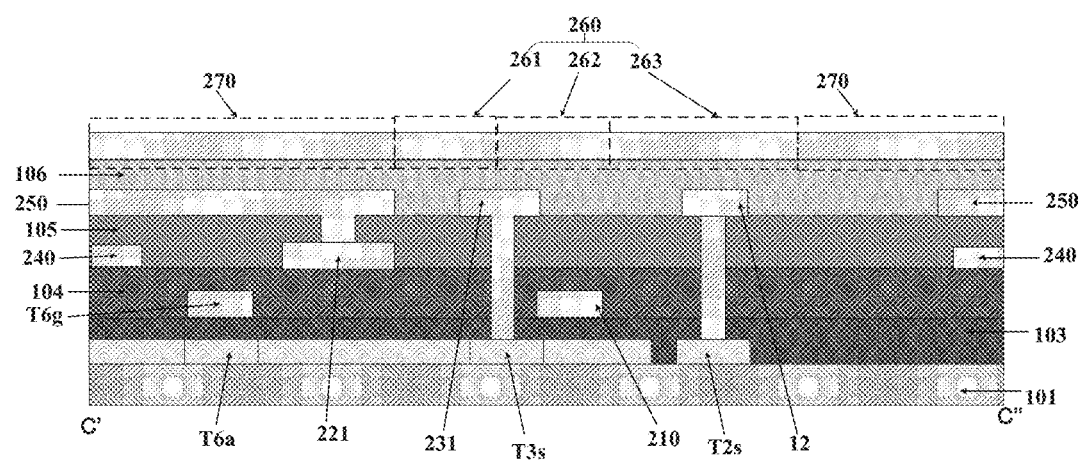
FIG. 4F is a cross-sectional view along a line C'-C" in FIG. 4D.

FIG. 4F illustrates a cross-sectional view along a line C'-C" in FIG. 4D. As shown in FIG. 4F, the sixth repeating part 261 and the seventh repeating part 262 of the third power supply line 260 overlap with the first connection electrode 231 in the direction perpendicular to the base substrate 101, respectively; the seventh repeating part 262 overlaps with the scan line 210 in the direction perpendicular to the base substrate 101; and the eighth repeating part 263 overlaps with the data line 12 in the direction perpendicular to the base substrate 101.

FIG. 5 illustrates the first electrodes 134a, 134b, 134c and 134d of the adjacent four sub pixels, for example, the first sub pixel 100a, the second sub pixel 100b, the third sub pixel 100c and the fourth sub pixel 100d constitute one repeating unit of the display substrate 20.

For example, in each repeating unit, the color of light emitted by the light emitting element of the second sub pixel 100b is the same as the color of light emitted by the light emitting element of the fourth sub pixel 100d, that is, the second sub pixel 100b and the fourth sub pixel 100d are sub pixels of the same color. For example, the second sub pixel 100b and the fourth sub pixel 100d are sub pixels having sensitive color. When the display substrate 20 adopts a red-green-blue (RGB) display mode, the sensitive color is green, that is, each of the second sub pixel 100b and the fourth sub pixel 100d is a green sub pixel. For example, the first sub pixel 100a may be a red sub pixel, and the third sub pixel 100c may be a blue sub pixel.

For example, in each repeating unit, the first sub pixel 100a and the third sub pixel 100c are alternately arranged in the row direction, and the second sub pixel 100b and the fourth sub pixel 100d are respectively located between the first sub pixel 100a and the third sub pixel 100c in adjacent rows and between the third sub pixel 100c and the first sub pixel 100a in the next repeating unit.

For example, in each repeating unit, the first sub pixel 100a and the third sub pixel 100c are alternately arranged in the column direction. In the repeating units of two adjacent rows, two first sub pixels 100a and two third sub pixels 100c located in two rows and two columns form a 2*2 matrix. In the matrix, the two first sub pixels 100a are located at diagonal positions of the matrix, and the two third sub pixels 100c are located at the other diagonal positions of the matrix. The two first sub pixels 100a and the two third sub pixels 100c surround one second sub pixel 100b or one fourth sub pixel 100d. The 2*2 matrix is repeated in the row and column directions by sharing one column or row of sub pixels.

For example, four sub pixels in each repeating unit may form two virtual pixels, and the first sub pixel 100a and the third sub pixel 100c in the repeating unit are respectively shared by the two virtual pixels. For example, as shown in FIG. 5, a first sub pixel 100a, an adjacent second sub pixel 100b at the right side of the first sub pixel 100a and a borrowed third sub pixel 100c in the adjacent (right) virtual pixel constitute one virtual pixel to form a light emitting pixel unit; and a third sub pixel 100c, an adjacent fourth sub pixel 100d at the right side of the third sub pixel 100c, and a borrowed first sub pixel 100a in the adjacent (right not shown) virtual pixel constitute one virtual pixel to form a light emitting pixel unit. The sub pixels in the plurality of repeating units form a pixel array. The sub pixel density is 1.5 times the virtual pixel density in a row direction of the pixel array and 1.5 times the virtual pixel density in a column direction of the pixel array.

For example, the second sub pixel 100b and the fourth sub pixel 100d belong to two virtual pixels, respectively.

It should be noted that, Firstly, since the first sub pixel 100a and the third sub pixel 100c are shared by two adjacent virtual pixels, the boundary of each virtual pixel is difficult to be distinguished, and thus the shape of each virtual pixel is not limited in the embodiment of the present disclosure. Secondly, the division of the virtual pixels is related to the driving manner, and the specific division manner of the virtual pixels may be determined according to the actual driving manner, which is not specifically limited by the present disclosure.

For example, the shape and size of the plurality of aperture regions of the sub pixels 100 may be changed according to light emitting efficiency, service life, or the like of the light emitting materials for emitting different colors of light. For example, the aperture region of the light emitting material having shorter light emitting life may be larger, thereby enhancing light emitting stability. For example, the size of the aperture region may be sequentially reduced in the order of the blue sub pixel, the red sub pixel, and the green sub pixel. Since the aperture region is on the first electrode 134, accordingly, as shown in FIG. 5, the area of the first electrodes 134a, 134b, 134c, and 134d of the first, second, third, and fourth sub pixels 100a, 100b, 100c, and 100*d* may be sequentially reduced in the order of the first, second, third, and fourth sub pixels 100*a*, 100*b*, 100*c*, and 100*d*.

The main body parts of the first electrodes of the light emitting elements in each row of sub pixels are arranged in the second direction and are staggered in the first direction. The main body part of the first electrode of one of two sub pixels arbitrarily adjacent in the second direction overlaps with the first capacitor electrode in the direction perpendicular to the base substrate, and the main body part of the first electrode of the other of the two sub pixels do not overlap with the first capacitor electrode in the direction perpendicular to the base substrate. For example, as shown in FIG. 5, the first electrode 134*b*/134*d* of the green sub pixel having the smallest area is between the first electrode 134*a* of the red sub pixel (the first sub pixel 100*a*) and the adjacent first electrode 134*c* of the blue sub pixel (the third sub pixel 100*c*), and the main body part of the first electrodes 134*b*/134*d* and the main body part of the first electrodes 134*a* and 134*c* are arranged alternately in the second direction. For example, the main body part of the first electrodes 134*a* and 134*c* overlaps with the first capacitor electrodes Ca in the sub pixels where the first electrodes 134*a* and 134*c* are located in the direction perpendicular to the base substrate respectively, and the main body part of the first electrodes 134*b* and 134*d* do not overlap with the first capacitor electrodes Ca in the sub pixels where the first electrodes 134*b* and 134*d* are located in the direction perpendicular to the base substrate respectively. Therefore, the space utilization rate of the layout can be increased, and the pixel density is increased. As shown in FIG. 5, the main body part 141 of each first electrode extends in a "Z" shape in the second direction D2.

For example, in the repeating unit row, the main body part of the first electrode 134 of the first sub pixel 100*a* and the third sub pixel 100*c* has a shape of, for example, a quadrangle, and is arranged in the row and column directions with the vertex angles thereof facing each other. The third power supply line 260 extends along the outline of the first electrodes 134 of the first sub pixel 100*a* and the third sub pixel 100*c* on the side distal to the second sub pixel 100*b* and the fourth sub pixel 100*d*. For example, the second sub pixel 100*b* and the fourth sub pixel 100*d* are between two corresponding adjacent sub pixels in a sub pixel row formed by the first sub pixel 100*a* and the third sub pixel 100*c* in the row direction, i.e., the direction D2. The main body part of the first electrode 134 of the second sub pixel 100*b* and the fourth sub pixel 100*d* has a shape of, for example, a quadrangle. The main body part of the first electrode 134 of the sub pixel has an edge opposite and parallel to that of adjacent sub pixel. The third power supply line 260 extends along the outline of the first electrode 134 of the first sub pixel 100*a* and the third sub pixel 100*c* on a side distal to the second sub pixel 100*b* and the fourth sub pixel 100*d*, and also extends along an outline of the first electrode 134 of the second sub pixel 100*b* and the fourth sub pixel 100D on a side distal to the first sub pixel 100*a* and the third sub pixel 100*c*. For example, the third power supply line 260 extends along the gap between the first electrode 134 of the sub pixel in the sub pixel row formed by the first sub pixel 100*a* and the third sub pixel 100*c* and the first electrode 134 of the sub pixel in the sub pixel row formed by the second sub pixel 100*b* and the fourth sub pixel 100*d*, thereby being formed in a wave shape. A peak is formed at an electrode vertex angle of the main body part of the first electrodes 134 of the first sub pixel 100*a* and the third sub pixel 100*c*, and a valley is formed at an electrode vertex angle of the main body part of the first electrodes 134 of the second sub pixel 100*b* and the fourth sub pixel 100*d*. The direction close to the previous row is the protruding direction of the peak, and the direction close to the next row is the protruding direction of the valley. For example, as shown in FIGS. 5 and 6, the connection part 142 of the first electrode 134 of each sub pixel is electrically coupled to the fourth connection electrode 234 through an via 308, so that the second electrode T5*d* of the fifth transistor T5 is electrically coupled to the first electrode 134 of the light emitting element 120. For example, the connection part 142 of the first electrode 134 at least partially overlaps with the fourth connection electrode 234 in the direction perpendicular to the base substrate 101.

For example, the aperture region 600 does not overlap with the connection part 142 of the first electrode 134 in the direction perpendicular to the base substrate 101, and an via 307 and the via 308 overlap with the connection part 142 of the first electrode 134 in the direction perpendicular to the base substrate 101, so as to prevent the via 308 and the via 307 from affecting the flatness of the light emitting layer in the aperture region and from affecting the light emitting quality. In some embodiments, the via 307 may partially overlap with the aperture region. Since the layer in which the via 307 is located is spaced apart from the layer in which the first electrode 134 is located by at least the layer in which the fourth connection electrode 234 is located and by the insulating layer in which the via 308 is located, the influence of the via 307 on the flatness of the aperture region is smaller than the influence of the via 308 on the flatness of the aperture region.

For example, for the first sub pixel 100*a* and the third sub pixel 100*c*, the fourth connection electrode is on a side of the first electrode 134 distal to the reset control line 220 in the pixel circuit, and correspondingly, the connection electrode of the first electrode 134 is also on a side of the first electrode 134 distal to the reset control line 220 in the pixel circuit, and the connection electrode of the first electrode 134 at least partially overlaps with the corresponding fourth connection electrode.

For example, for the second sub pixel 100*b* and the fourth sub pixel 100*d*, the fourth connection electrode is on a side of the first electrode 134 proximal to the reset control line 220 in the pixel circuit, and correspondingly, the connection electrode of the first electrode 134 is also on a side of the first electrode 134 distal to the reset control line 220 in the pixel circuit, and the connection electrode of the first electrode 134 at least partially overlaps with the corresponding fourth connection electrode.

For example, as shown in FIG. 6, the display substrate 20 further includes a pixel defining layer 108 on the first electrode of the light emitting element. An aperture is formed in the pixel defining layer 108 to define the aperture region 600 of the display substrate. The light emitting layer 136 is formed at least in the aperture (the light emitting layer 136 may also cover a portion of the pixel defining layer), and the second electrode 135 is formed on the light emitting layer 136, thereby forming the light emitting element 120. For example, the second electrode 135 may be a common electrode, and is arranged throughout the surface of the display substrate 20. For example, the first electrode is an anode of the light emitting element, and the second electrode is a cathode of the light emitting element.

For example, referring to FIG. 5 and FIG. 6, as shown in FIG. 5, for each pixel circuit, the orthogonal projection of each of the via 307 and the via 308 on the base substrate 101 is within the orthogonal projection of the third connection electrode 234 on the base substrate. For example, the via 307 and the via 308 are arranged in parallel in the direction D1, and a center line of the via 307 along the first direction D1 is substantially coincident with a center line of the via 308 along the first direction D1. In a direction parallel to the surface of the base substrate 101, the via 308 is farther away from the main body part 141 of the first electrode 134 than the via 307, so that relative to the aperture region 600 of the sub pixel (for example, the area of the first electrode 134 is larger than the area of the corresponding aperture region 600, and the aperture region 600 is located at a central region of the first electrode 134), the orthographic projection of the via 308 on the base substrate 101 is farther away from the orthographic projection of the aperture region 600 on the base substrate than the orthographic projection of the via 307 on the base substrate 101. Since the insulating layer (for example, the second planarization layer) where the via 308 is located is closer to the main body part 142 of the first electrode 134 than the insulating layer (for example, the first planarization layer) where the via 307 is located in the direction perpendicular to the base substrate 101, the influence of the via 308 on the flatness of the first electrode 134 is greater. The influence of the via on the flatness of the light emitting layer 136 in the aperture region can be reduced by disposing the via 308 farther away from the aperture region or the main body part of the first electrode 134 (on the surface parallel to the base substrate), thereby enhancing the performance of the light emitting element.

For example, in a row of repeating units, the vias 307 and 308 in the pixel circuits of the first sub pixel 100a and the third sub pixel 100c are both located at a side of the first electrode 134 distal to the reset control line 220 in the pixel circuit, and the corresponding fourth connecting electrodes of the second sub pixel 100b and the fourth sub pixel 100d are located at a side of the first electrode 134 proximal to the reset control line 220 in the pixel circuit. That is, in a row of repeating units, the vias 307 and 308 in the pixel circuits of the sub pixels are both between the row in which the first sub pixel 100a and the third sub pixel 100c are located and the row in which the second sub pixel 100b and the fourth sub pixel 100d are located.

For example, in one repeating unit, the shape of the fourth connecting electrode in each of the pixel circuits of the first sub pixel 100a, the third sub pixel 100c, the second sub pixel 100b and the fourth sub pixel 100D is substantially the same and are arranged substantially in a line parallel to the direction D2. For example, the via 307 and the via 308 in the orthographic projection of the fourth connection electrode do not overlap or not overlap completely with each other, thereby avoid poor connection, disconnection or unevenness at the position of the via due to the via stacking in the direction perpendicular to the base substrate. For example, the vias 307 of the first sub pixel 100a and the third sub pixel 100c are arranged substantially in the same line as that the vias 308 of the second sub pixel 100b and the fourth sub pixel 100d are arranged, and the vias 308 of the first sub pixel 100a and the third sub pixel 100c are arranged substantially in the same line as that the vias 307 of the second sub pixel 100b and the fourth sub pixel 100d are arranged.

For example, as shown in FIG. 6, the orthographic projection of the aperture region 600 on the base substrate 101 does not overlap with the orthographic projection of the via 308 on the base substrate 101. For example, the orthographic projection of the aperture region 600 on the base substrate 101 does not overlap with the orthographic projection of the fourth connection electrode 234 on the base substrate 101. This contributes to enhancement of the flatness of the light emitting layer 136 and thus to enhancement of light emitting efficiency.

As shown in FIG. 1A, since the height difference due to the first power supply line 270 causes the warpage of the layers in the at least one of the two portion of the orthographic projection of the aperture on the base substrate divided by the orthographic projection of the first power supply line, a color shift is caused due to the warpage. The ratio between the area ratio between the first portions of the orthographic projection of the aperture of the sub pixels of different colors and the area ratio between the second portions of the forward projection of the aperture of the sub pixels of different colors is within a certain range, for example, from 0.8 to 1.2 by adjusting the line width of the first power supply line 270.

The width of the first power supply line 270 in the orthographic projection of the aperture is adjusted, for example, the line width of the first repeating part is adjusted in a range from 3 μm to 4.6 μm, the line width of the second repeating part is adjusted in a range from 4.5 μm to 6.9 μm, the line width of the third repeating part is adjusted in a range from 3 μm to 4.6 μm, the line width of the fourth repeating part is adjusted in a range from 5.3 μm to 8.1 μm, and the line width of the fifth repeating part is adjusted in a range from 2.4 μm to 3.6 μm, so that the ratio of the area ratio between the first portions of the orthographic projections of the apertures to the area ratio between the second portions of the orthographic projections of the apertures is in the above-mentioned range from 0.8 to 1.2. In one specific example, the first repeating part may have a line width of 3.8 μm, the second repeating part may have a line width of 5.7 μm, the third repeating part may have a line width of 3.8 μm, the fourth repeating part may have a line width of 6.7 μm, and the fifth repeating part may have a line width of 3.0 μm.

For example, referring to FIGS. 1A and 5A, the width of the first power supply lines 270 in the orthographic projections of the apertures of the R and B sub pixels is adjusted from 4.3 μm to 3.8 μm, and the width of the first power supply line 270 in the orthographic projections of the apertures of the G' and G" sub pixels is adjusted from 4.4 μm and 4.7 μm to 3.0 vs m, so that the ratio of the area ratio between the first portions of the orthographic projections of the apertures of the sub pixels of different colors to the area ratio between the second portions of the orthographic projections of the apertures of the sub pixels of different colors is within the above range.

In one specific example, the ratio of the area ratio between the first portions of the orthographic projections of the apertures to the area ratio between the second portions of the orthographic projections of the apertures is 1. For example, the ratio of the first portions of the orthographic projections of the apertures of the red sub pixels to the sum of the first portions of the orthographic projections of the apertures of the first green sub pixels G' and the second green sub pixels G" (i.e., the green sub pixel) is R1/(G'1+G"1)=1:1.04, and the ratio of the second portions of the orthographic projections of the apertures of the red sub pixels to the sum of the second portions of the orthographic projections of the apertures of the first green sub pixels G' and the second green sub pixels G" is R2/(G'2+G"2)=1:1.04. The area ratio of the first portions of the orthographic projections of the apertures of the red sub pixels to the first portions of the orthographic projections of the apertures of the blue sub pixels is R1/B1=1:1.644, and the area ratio of the second portions of the orthographic projections of the apertures of the red sub pixels to the second portions of the orthographic projections of the apertures of the blue sub pixels is R2/B2=1:1.644. The area ratio of the first portions of the orthographic projections of the apertures of the blue sub pixel to the sum of the first portions of the orthographic projections of the apertures of the first and second green sub pixels is B1/(G'1+G"1)=1.04: 1.644, and the area ratio of the second portions of the orthographic projections of the apertures of the blue sub pixel to the sum of the second portions of the orthographic projections of the apertures of the first and second green sub pixels is B2/(G'2+G"2)=1.04:1.644.

That is, both the area ratio between the first portion of the orthographic projection of the aperture of the red sub pixel, the sum of the first portions of the orthographic projections of the apertures of the first and second green sub pixels G' and G", and the first portion of the orthographic projection of the aperture of the blue sub pixel: R1:(G'1+G"1):B1, and the area ratio between the second portion of the orthographic projection of the aperture of the red sub pixel, the sum of the second portions of the orthographic projections of the apertures of the first and second green sub pixels G' and G", and the second portion of the orthographic projection of the aperture of the blue sub pixel: R2:(G'2+G"2):B2, are 1:1.04: 1.644. By adopting the above apertures, the transmitted light of the sub pixels of the three colors can be mixed to generate white light.

In this way, one pixel unit including a plurality of sub pixels and even the pixel units on the whole display substrate may emit white light even if the warpage occurs, due to the fact that the light transmission ratio among the sub pixels with different colors corresponding to the first portions of the orthographic projection of the apertures is equal to the light transmission ratio among the sub pixels with different colors corresponding to the second portions of the orthographic projections of the apertures, thereby alleviating color shift.

As shown in FIG. 4C, the second power supply line 250 has a shape of a bar and extends along the first direction D1. As shown in FIG. 4D, an orthographic projection of the second power supply line 250 on the base substrate at least partially overlaps with the orthographic projection of the first power supply line 260 on the base substrate. The width of the first power supply line may not be equal to the width of the second power supply line at the positions, where the orthographic projections of the plurality of apertures on the base substrate are located, by adjusting the width of the first power supply line.

As shown in FIG. 5, in the case where one pixel includes a red sub pixel, a blue sub pixel, a first green sub pixel, and a second green sub pixel, each of the orthographic projections of the apertures (181a, 181c, 181d, and 181d) of the red, blue, first green, and second green sub pixels respectively on the substrate are divided into two portions, for example, the first portion on a first side (left side) and the second portion on a second side (right side), by the orthographic projections of the first power supply lines on the base substrate. The area ratio between the first portions of the apertures of the red sub pixel, the first portions of the apertures of the blue sub pixels, and the sum of the first portions of the apertures of the first green sub pixels and the first portions of the apertures of the second green sub pixels is equal to the area ratio between the second portions of the apertures of the red sub pixels, the second portions of the apertures of the blue sub pixels, and the sum of the second portions of the apertures of the first green sub pixels and the second portions of the apertures of the second green sub pixels, for example, the area ratio may be 1:1.04:1.644.

For example, the base substrate 101 may be a rigid substrate such as a glass substrate, a silicon substrate, or the like, or the base substrate 101 may be made of a flexible material having excellent heat resistance and durability, such as polyimide (PI), polycarbonate (PC), polyethylene glycol terephthalate (PET), polyethylene, polyacrylate, polyarylate, polyetherimide, polyethersulfone, polyethylene terephthalate (PET), polyethylene (PE), polypropylene (PP), polysulfone (PSF), polymethylmethacrylate (PMMA), cellulose triacetate (TAC), cycloolefin polymer (COP), and cycloolefin copolymer (COC), or the like.

For example, a material of the semiconductor layer 102 includes, but is not limited to, a silicon-based material (amorphous silicon a-Si, polysilicon p-Si, etc.), a metal oxide semiconductor (IGZO, ZnO, AZO, IZTO, etc.), and an organic material (hexa thiophene, polythiophene, etc.).

For example, a material of the first to fourth conductive layers may include gold (Au), silver (Ag), copper (Cu), aluminum (Al), molybdenum (Mo), magnesium (Mg), tungsten (W), and an alloy material combined by the above metals; or the material of the first to fourth conductive layers may include a conductive metal oxide material, such as Indium Tin Oxide (ITO), Indium Zinc Oxide (IZO), zinc oxide (ZnO), zinc aluminum oxide (AZO), or the like.

For example, the light emitting element 120 has a structure of top emission, with a reflective first electrode 134 and a transparent or semi-transparent second electrode 135. For example, the first electrode 134 as an anode is made of a high work function material, such as an ITO/Ag/ITO stacking; the second electrode 135 as a cathode is made of a low work function material, such as a semi-transparent metal or a metal alloy material, for example a Ag/Mg alloy material.

For example, each of the first insulating layer 103, the second insulating layer 104, and the third insulating layer 105 is, for example, an inorganic insulating layer including an insulating material, such as an oxide of silicon (silicon oxide), a nitride of silicon (silicon nitride), an oxynitride of silicon (silicon oxynitride), or the like; or each of the first insulating layer 103, the second insulating layer 104, and the third insulating layer 105 is made of an insulating material including a metal oxynitride such as aluminum oxide, titanium nitride, or the like. For example, each of the fourth insulating layer 106, the fifth insulating layer 107, and the pixel defining layer 108 is made of an organic insulating material, such as polyimide (PI), acrylate, epoxy, polymethyl methacrylate (PMMA), or the like. For example, the fourth insulating layer 106 and the fifth insulating layer 107 are planarization layers.

As shown in FIG. 2, the pixel circuit of the first sub pixel 100a is electrically coupled to the first data line 12a to receive the data signal Vd, and the pixel circuit of the second sub pixel 100b is electrically coupled to the second data line 12b to receive the data signal Vd. For example, the second data line 12b is between the pixel circuit of the first sub pixel 100a and the pixel circuit of the second sub pixel 100b.

As shown in FIG. 2, the first capacitor electrode Caa in the first sub pixel 100a and the first capacitor electrode Cab in the second sub pixel 100b are spaced apart from each other, that is, the first capacitor electrodes Ca in the first sub pixel 100a and the second sub pixel 100b are disconnected from each other in the conductive layer where they are located. This arrangement can reduce the connection between the adjacent first capacitor electrodes Ca and the overlapping of the adjacent first capacitor electrodes Ca with other signal lines, thereby reducing the parasitic capacitor.

For example, the first capacitor electrodes Ca in the sub pixels 100 have substantially the same area and shape.

For example, the first capacitor electrodes Ca in the respective sub pixels 100 have the same relative position in the sub pixels. For example, the first capacitor electrodes Ca in each row of the sub pixels 100 are linearly arranged along the second direction D2.

For example, the first capacitor electrodes Ca in the respective sub pixels have a shape of an island in the conductive layer where they are located, i.e., the first capacitor electrodes Ca are not electrically coupled to other structures in the conductive layer where they are located.

Figure 7:
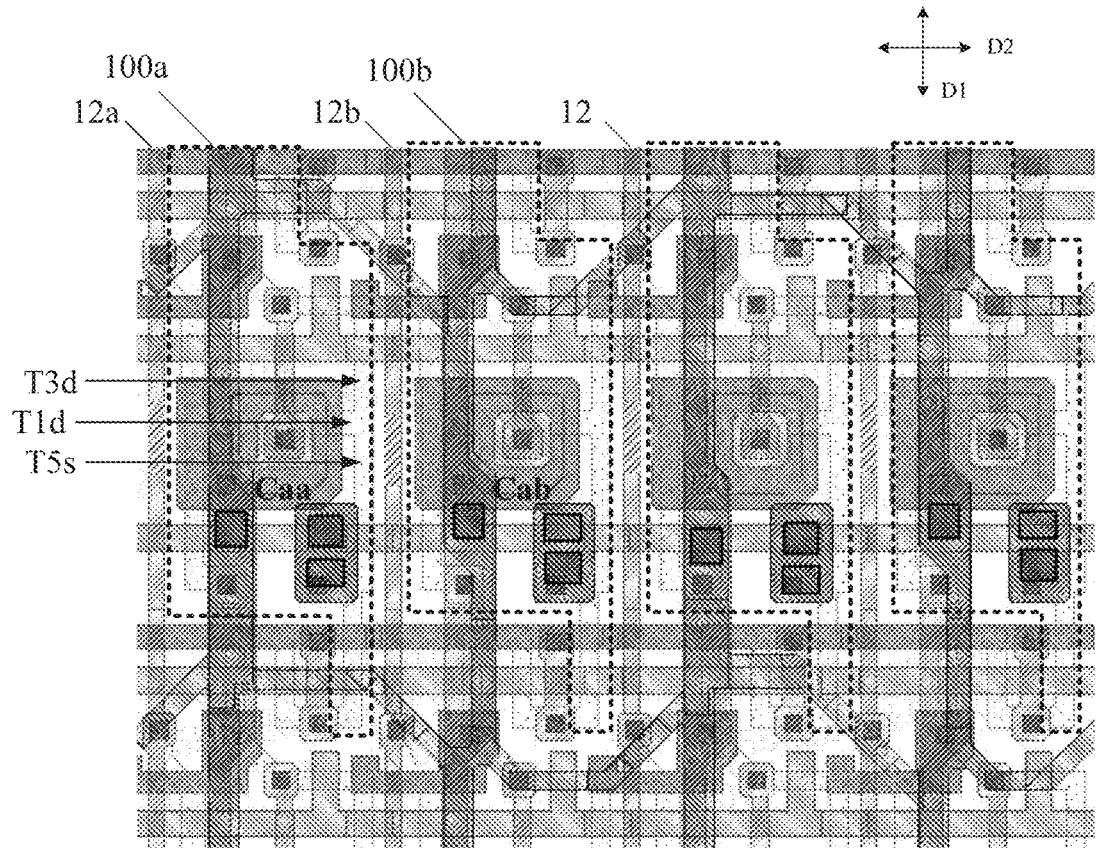
FIG. 7 is a schematic diagram illustrating a display substrate according to an embodiment of the present disclosure.

For example, as shown in FIG. 7, a junction where the second electrode T3d of the third transistor T3, the second electrode T1d of the first transistor T1, and the first electrode T5s of the fifth transistor T5 in the pixel circuit of the first sub pixel 100a are coupled to each other exists between the adjacent first capacitor electrodes Ca. The first capacitor electrode Caa in the first sub pixel 100a and the first capacitor electrode Cab in the second sub pixel 100b are not coupled to each other, so that the first capacitor electrode Cab in the second sub pixel 100b and the junction are prevented from generating a parasitic capacitor due to overlapping with each other, the parasitic capacitor adversely affecting a signal at the junction. For example, each of the orthographic projections of the second electrode T3d of the third transistor T3, the second electrode T1d of the first transistor T1 and the first electrode T5s of the fifth transistor T5 in the first sub pixel 100a on the base substrate does not overlap with the orthographic projection of the first capacitor electrode Cab in the second sub pixel 100b on the substrate 101.

For example, the first capacitor electrode Ca in the sub pixel 100 is in a range not exceeding the pixel region (the region where the pixel circuit is located) of the sub pixel, that is, the first capacitor electrode Ca in the sub pixel 100 does not extend into the pixel region of the adjacent sub pixel and does not overlap with the structures of the adjacent sub pixel, thereby avoiding crosstalk.

For example, as shown in FIG. 7, the second data line 12b is between the first capacitor electrodes Ca of the adjacent first and second sub pixel 100a and 100b. The orthographic projections of the first capacitor electrode Caa of the first sub pixel 100a and the first capacitor electrode Cab of the second sub pixel 100b on the substrate do not overlap with the orthographic projection of the second data line 12b. The first capacitor electrode Caa in the first sub pixel 100a and the first capacitor electrode Cab in the second sub pixel 100b are not coupled to each other to prevent from generating a parasitic capacitor due to the overlapping of the first capacitor electrodes with the second data line 12b. The overlapping of the first capacitor electrodes with the second data line 12b may cause adverse effects on the transmission of the data signal on the data line, such as delay of the data signal. On the other hand, since generally the data signal Vd is a high frequency signal and the first power voltage VDD is transmitted through the first capacitor electrode Ca, the first power voltage is likely to change suddenly with the sudden change of the data signal Vd due to the existence of the parasitic capacitor. The resistance-capacitance load formed between the first capacitor electrode Ca and the data line is too large, so that the first power voltage cannot be recovered in a short time after the sudden change occurs. Based on the formula of the saturation current of the first transistor T1 in the light emission period: Id=k/2 (Vd-VDD)2, the fluctuation of the first power supply voltage VDD causes the fluctuation of the driving current, thereby causing the light emission luminance to be unstable. Therefore, the first capacitor electrode Caa in the first sub pixel 100a and the first capacitor electrode Cab in the second sub pixel 100b are not coupled to each other to contributes to improving the stability of light emission of the light emitting element. As shown in FIG. 7, for example, a distance between the orthogonal projection of the drain electrode T1d of the first sub pixel 100a adjacent to the second data line 12b on the base substrate and the orthogonal projection of the second data line 12b on the base substrate may be 1.75 µm; and for example, a distance between the orthogonal projection of the source electrode TIs of the first sub pixel 100b adjacent to the second data line 12b on the base substrate and the orthogonal projection of the second data line 12b on the base substrate may be 2.8 µm. The distance between the second data line 12b and the source or drain of its adjacent sub pixel may also be other values to avoid overlapping.

The inventors of the present disclosure have discovered that a parasitic capacitor is generated between the data line 12 and the second capacitor electrode Cb of the storage capacitor Cst due to the overlapping between the signal lines, which affects the stability of the storage capacitor Cst. Since the storage capacitor Cst is configured to store the information related to the data signal Vd and the threshold voltage of the driving sub circuit, the driving sub circuit 122 is controlled during the light emitting phase by using the stored information, to compensate the output of the driving sub circuit 122. The stability of the voltage (stored information) across the storage capacitor Cst may affect the stability of the display gray scale, and thus the quality of the display screen may be affected.

Figure 8A:
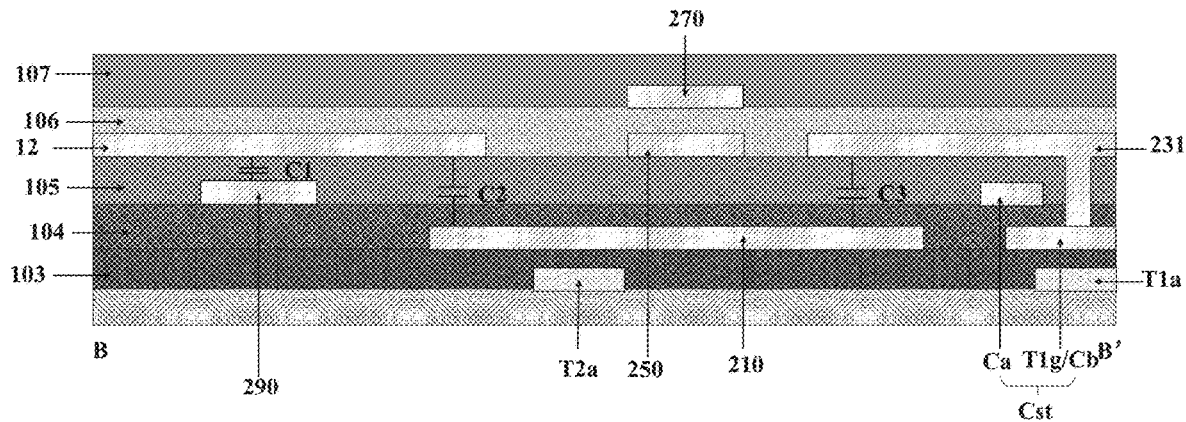
FIG. 8A is a cross-sectional view along a line B-B' in FIG. 2.

In other embodiments of the present disclosure, a display substrate is provided. As shown in FIGS. 2 and 8A, the first capacitor electrode Ca in at least one sub pixel includes an extension part 290. The extension part 290 overlaps with the data line 12 coupled to the sub pixel in the direction perpendicular to the base substrate 101 to provide the first capacitor C1.

Due to the presence of the first capacitor C1, the fluctuation of the data signal on the data line 12 is coupled to the second capacitor electrode Cb of the storage capacitor Cst via a parasitic capacitor, while the fluctuation of the data signal on the data line 12 is coupled to the first capacitor electrode Ca of the storage capacitor Cst via the first capacitor C1, which enhances the stability of information stored in the storage capacitor Cst and the display performance.

Figure 8B:
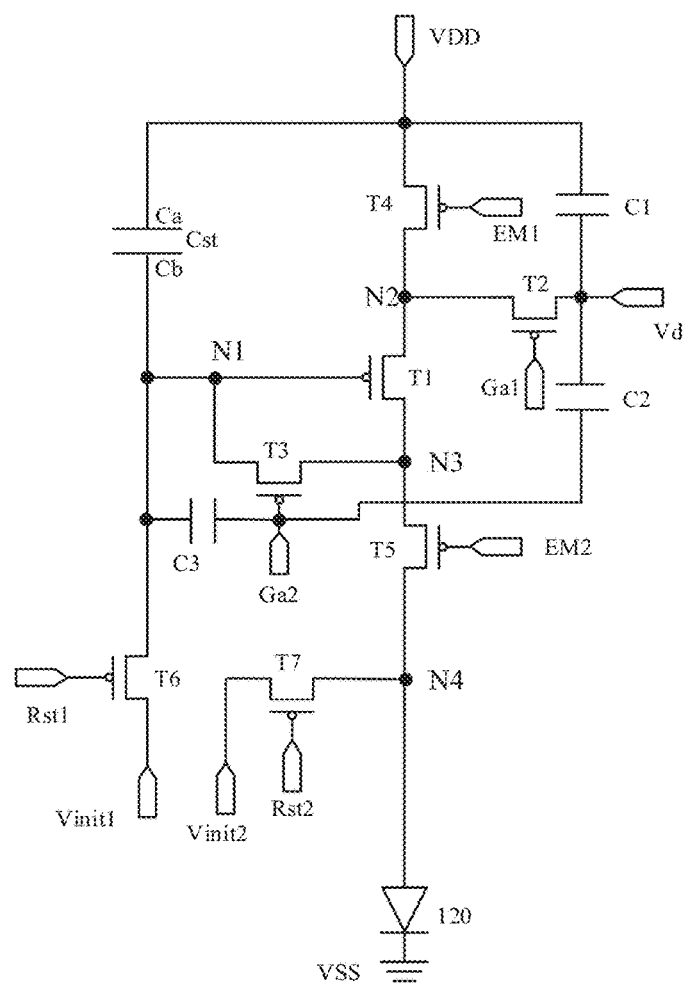
FIG. 8B is a circuit diagram of a pixel circuit in a display substrate according to an embodiment of the present disclosure.

FIG. 8A shows a cross-sectional view along a line B-B' in FIG. 2, and FIG. 8B shows an equivalent circuit diagram of the pixel circuit. Referring to FIGS. 2 and 8A-8B, the data line 12 overlaps with the scan line 210 in the direction perpendicular to the base substrate 101 to form a second capacitor C2, and the first connection electrode 231 overlaps with the scan line 210 in the direction perpendicular to the base substrate 101 to form a third capacitor C3.

Since the first connection electrode 231 is electrically coupled to the second capacitor electrode Cb of the storage capacitor Cst, the second capacitor C2 and the third capacitor C3 are coupled to each other in series between the data line 12 and the second capacitor electrode Cb of the storage capacitor Cst. The fluctuation of the data signal on the data line 12 may be coupled to the second capacitor electrode Cb of the storage capacitor Cst via the second capacitor C2 and the third capacitor C3. Meanwhile, due to the presence of the first capacitor C1, the fluctuations of the data signal on the data line 12 are also coupled to the first capacitor electrode Ca of the storage capacitor Cst via the first capacitor C1, which enhances the stability of information stored in the storage capacitor Cst and the display performance.

For example, the capacitance value of the first capacitor C1 is approximately equal to the capacitance value of the second capacitor C2 and the third capacitor C3 coupled to each other in series, for example, the capacitance value of the first capacitor C1 is equal to the capacitance value of the second capacitor C2 and the third capacitor C3 coupled to each other in series, i.e., $C1=(C2*C3)/(C2+C3)$.

For example, the extension part 290 extends (protrudes) from the main body part of the first capacitor electrode Ca towards the data line 12 overlapping with the extension part 290. For example, the first capacitor electrode Ca has a shape of a reversed convex toward the data line in the pixel circuit in which the first capacitor electrode Ca is located. That is, the first capacitor electrode Ca is a substantially rectangular electrode block, has a protrusion protruding toward the data line at a side proximal to the data line in the pixel circuit, and is located at the substantially middle of the side. A via exits inside the first capacitor electrode Ca.

For example, in this case, the first capacitor electrode Ca still does not exceed the pixel region where the sub pixel is located, that is, the first capacitor electrode Ca of the pixel circuit does not extend into the pixel region of the adjacent sub pixel to overlap with the structures of the adjacent sub pixel, thereby avoiding crosstalk.

Figure 9:
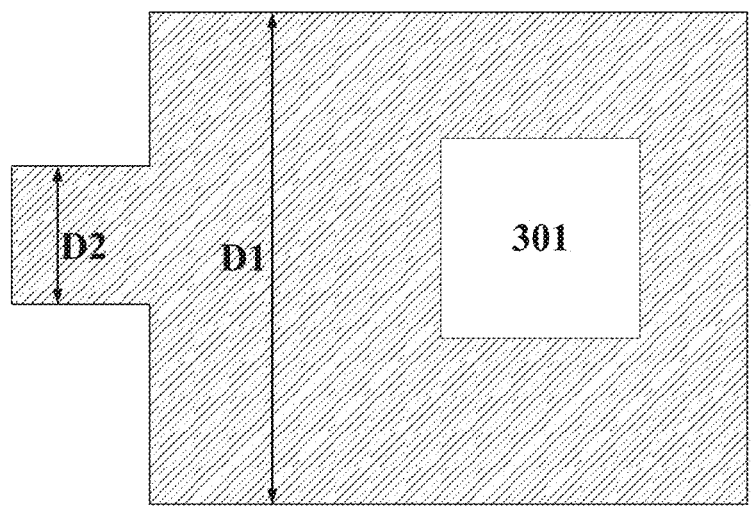
FIG. 9 is a schematic diagram illustrating a first capacitor electrode according to an embodiment of the present disclosure.

FIG. 9 is a schematic diagram illustrating the first capacitor electrode Ca. As shown in FIG. 9, for example, the ratio of the area of the extension part 290 to the area of the first capacitor electrode Ca is in a range from 1/10 to 1/3, such as 1/5.

For example, in the first direction D1, the ratio of the maximum dimension of the extension part 290 to the maximum dimension of the first capacitor electrode is in a range from 1/4 to 1/2, for example 1/3.

In at least one embodiment of the present disclosure, a display panel is further provided, which includes any one of the above display substrates 20. It should be noted that, the display substrate 20 provided in the at least one embodiment of the present disclosure may include the light emitting element 120, or the display substrate 20 may not include the light emitting element 120, that is, the light emitting element 120 may be formed in a panel factory after the display substrate 20 is completed. In a case where the display substrate 20 itself does not include the light emitting element 120, the display panel provided by the embodiment of the present disclosure further includes the light emitting element 120 besides the display substrate 20.

Figure 10:
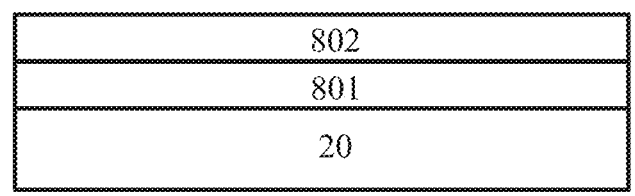
FIG. 10 is a schematic diagram illustrating a display panel according to an embodiment of the present disclosure.

For example, the display panel may be an OLED display panel, and accordingly, the display substrate 20 included in the display panel may be an OLED display substrate. As shown in FIG. 10, for example, the display panel 30 further includes an encapsulation layer 801 and a cover plate 802 on the display substrate 20. The encapsulation layer 801 is configured to seal the light emitting element on the display substrate 20 to prevent the light emitting element and the driving sub circuit from being damaged by external moisture and oxygen. For example, the encapsulation layer 801 may include an organic thin film or a structure in which an organic thin film and an inorganic thin film are alternately stacked. For example, a water absorption layer (not shown) may be further between the encapsulation layer 801 and the display substrate 20, and the water absorption layer may be configured to absorb water vapor or sol remaining in the light emitting device during the previous manufacturing process. The cover plate 802 may be, for example, a glass cover plate. For example, the cover plate 802 and the encapsulation layer 801 may be a structure formed as a single piece.

Figure 11:
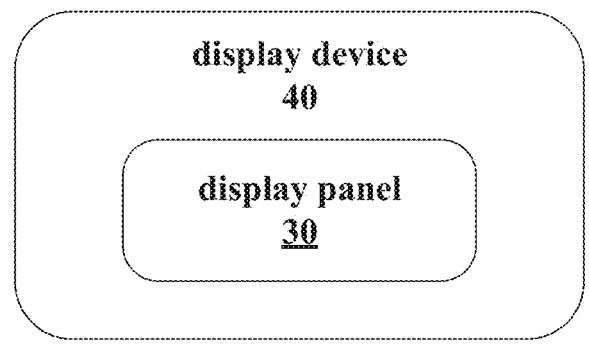
FIG. 11 is a schematic diagram illustrating a display device according to an embodiment of the present disclosure.

In at least one embodiment of the present disclosure, a display device 40 is further provided. As shown in FIG. 11, the display device 40 may include any one of the display substrates 20 or the display panels 30. The display device in the embodiments may be any product or component with a display function, such as a display, an OLED panel, an OLED television, electronic paper, a mobile phone, a tablet computer, a notebook computer, a digital photo frame, a navigator, or the like.

In an embodiment of the present disclosure, a manufacturing method for the display substrate 20 is further provided. The structure and the manufacturing method of the display substrate provided by the embodiments of the present disclosure will be exemplarily described below with reference to FIG. 2, FIGS. 4A to 4E, and FIGS. 5 to 6, but the embodiments of the present disclosure are not limited thereto.

Figure 12:
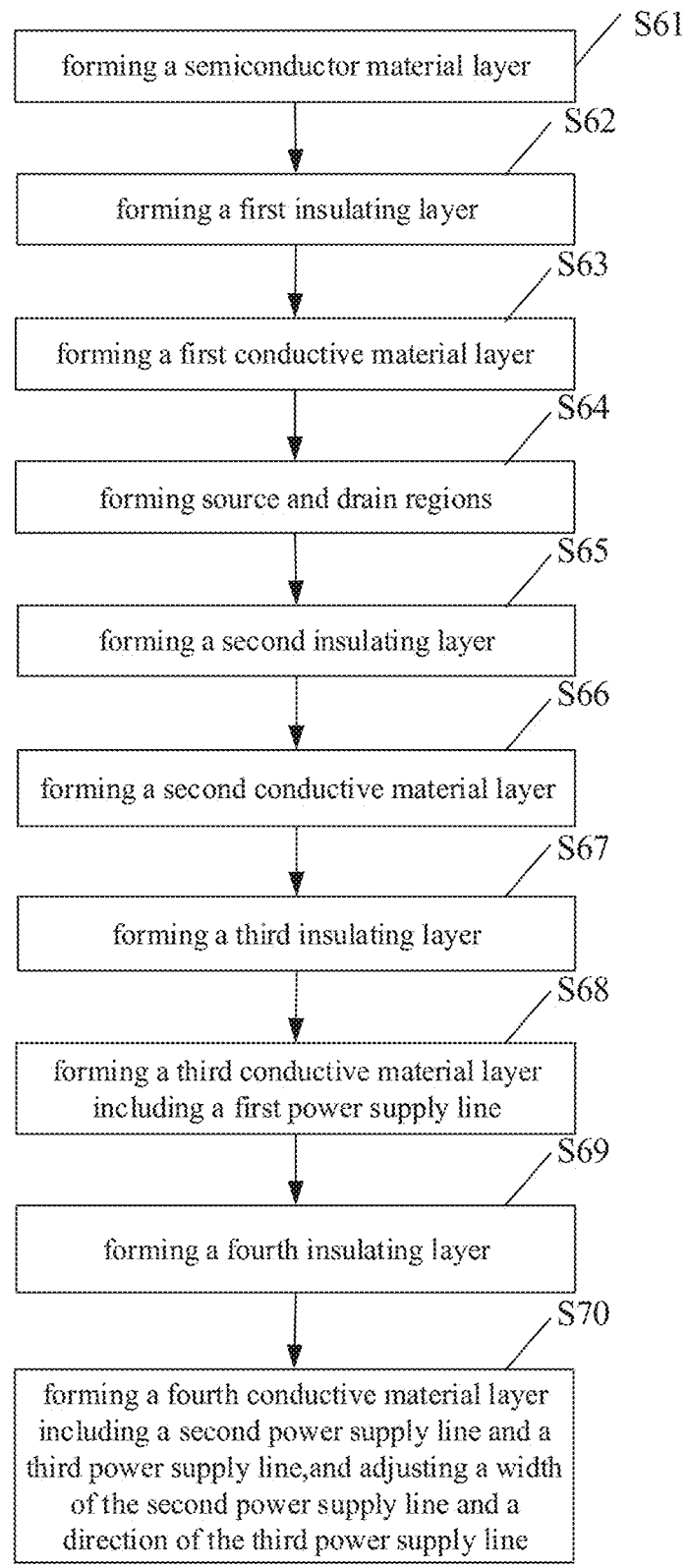
FIG. 12 is a flowchart illustrating a method for manufacturing a display substrate according to an embodiment of the present disclosure.

In some examples, the manufacturing method includes the following steps S61 to S70 as shown in FIG. 12.

At step S61, a semiconductor material layer is formed on the base substrate and is patterned by a patterning process to form a semiconductor layer 102 as shown in FIG. 4A. The semiconductor layer 102 includes active layers T1a-T7a and doped regions (i.e., source and drain regions) of the first to seventh transistors T1-T7 in each of the pixel regions. The active layers and the doped regions of the transistors in the same pixel region are formed as a single piece.

It should be noted that, the active layer may include an integrally formed low-temperature polysilicon layer, in which the source region and the drain region may be conductive by doping or the like to achieve electric connection between the structures. That is, the active semiconductor layers of the transistors of each of the sub pixels is formed as a whole pattern made of p-silicon, and each of the transistors in the same pixel region includes the doped regions (i.e., the source and drain regions) and the active layer. The active layers of different transistors are separated from each other by a doped region.

At step S62, a first insulating layer 103 (which may be, for example, a transparent layer), such as a gate insulating layer, is formed on the semiconductor layer 102, and a plurality of first insulating layer vias are formed in the first insulating layer for coupling to a pattern of a subsequently formed third conductive layer 203. For example, the first insulating layer vias are formed in the first insulating layer at the corresponding positions of the source and drain regions in the semiconductor layer, respectively, i.e., the first insulating layer vias overlap with the source and drain regions in the semiconductor layer, respectively, for coupling the source and drain regions to the data line 12, the second power supply line 250, the first connection electrode 231, the second connection electrode 232, and the third connection electrode 233 or the like in the third conductive layer. For example, the first insulating layer vias penetrating through the first insulating layer include a via 402, a via 405, a via 303, a via 305, or the like.

At step S63, a first conductive material layer is formed on the first insulating layer and is patterned to form the first conductive layer 201 as shown in FIG. 3A. That is, the scan line 210, the reset control line 220, and the light emitting control line 230, which are insulated from each other and extend in the second direction, are formed. For example, the reset control line 220, the scan line 210, and the light emitting control line 230, which are correspondingly coupled to one row of pixel circuits, are sequentially arranged in the first direction D1.

For example, the first conductive layer 201 further includes the gates T1g-T7g of the first to seventh transistors T1-T7. For example, the gate T6g of the sixth transistor T6 and the reset control line 220 are a structure formed as a single piece, that is, a portion of the reset control line 220 serves as the gate T6*g* of the sixth transistor T6; the gate T2*g* of the second transistor T2 and the scan line 210 are a structure formed as a single piece, that is, a portion of the scan line 210 serves as the gate T2*g* of the second transistor T2; the gate T4*g* of the fourth transistor T4 and the gate T5*g* of the fifth transistor T5 are a structure formed as a single piece with the light emitting control line 230, that is, a portion of the light emitting control line 230 serves as the gate T4*g* of the fourth transistor T4 and the gate T5*g* of the fifth transistor T5; the gate T7*g* of the seventh transistor T7 is a structure formed as a single piece with the reset control line 220 corresponding to the next row of pixel circuits. For example, both the sixth transistor T6 and the third transistor T3 have dual gate structures. Both the two gates T6*g* of the sixth transistor T6 are a portion of the reset control line 220, one gate of the third transistor T3 is a portion of the scan line 210, and the other gate of the third transistor T3 is a portion of the scan line 210 which is formed as a single piece with the scan line 210 and protrudes toward the reset control line 220.

For example, the overlapping portion of the semiconductor layer 102 with the first conductive layer 201 in the direction perpendicular to the base substrate defines the active layers (channel regions) T1*a* to T7*a* of the first to seventh transistors T1 to T7.

For example, in the direction D1, the gate of the second transistor (e.g., a data writing transistor) T2, the gate of the third transistor (e.g., a threshold compensation transistor) T3, the gate of the sixth transistor (e.g., a first reset transistor) T6, and the gate of the seventh transistor (e.g., a second reset transistor) T7 are all located on a first side of the gate of the first transistor (e.g., a driving transistor) T1, and the gate of the fourth transistor (e.g., a first light emitting control transistor) T4 and the gate of the fifth transistor (e.g., a second light emitting control transistor) T5 are all located on a second side of the gate of the first transistor T1. In a plane parallel to the base substrate, the first side of the gate of the first transistor T1 in the same pixel region may be a side of the gate T1*g* of the first transistor T1 proximal to the scan line 210, and the second side of the gate of the first transistor T1 may be a side of the gate of the first transistor T1 distal to the scan line 210.

For example, in the second direction D2, the gate of the second transistor T2 and the gate of the fourth transistor T4 are located at a third side of the gate of the first transistor T1; and the first gate (the gate formed as a single piece with the scan line 210) of the third transistor T3, the gates of the fifth and seventh transistor T5 and T7 are located at a fourth side of the gate of the first transistor T1. For example, the third and fourth sides of the gate of the first transistor T1 in the same pixel region are opposite sides of the gate of the first transistor T1 in the direction D2. For example, the third side of the gate of the first transistor T1 in the same pixel region may be the left side of the gate of the first transistor T1, and the fourth side of the gate of the first transistor T1 may be the right side of the gate of the first transistor T1. As for the left and right sides, for example, in the same pixel region, the data line 12 is on the left side of the second power supply line 250, and the second power supply line 250 is on the right side of the data line.

At step S64, as shown in FIG. 4A, a conducting treatment (e.g., doping treatment) is performed on the semiconductor layer 102 by using the first conductive layer 201 as a mask (i.e., a self-aligned process), so that the portions of the semiconductor layer 102 not covered by the first conductive layer 201 are made to be conductive, and the portions of the semiconductor layer 102 on both sides of the active layer of each of the transistors are made to be conductive to form the source and drain regions of the first to seventh transistors T1-T7, i.e., the first electrodes (Tis-T7*s*) and the second electrodes (T1*d*-T7*d*) of the first to seventh transistors T1-T7, respectively.

At step S65, a second insulating layer 104 (which may be, for example, a transparent layer), which may be, for example, a second gate insulating layer, is formed on the first conductive layer 201. At least second insulating vias corresponding to the first insulating vias are formed in the second insulating layer. For example, corresponding vias that extend through at least the first and second insulating layers include at least a via 402, a via 405, a via 303, a via 305, or the like.

At step S66, a second conductive material layer is formed on the second insulating layer 104, and the second conductive material layer is patterned to form the second conductive layer 202 as shown in FIG. 4B, that is, the second conductive material layer is patterned to form a shielding electrode 221, a first capacitor electrode Ca, and a reset voltage line 240, which extends in the first direction and insulates from each other.

For example, the shielding electrode 221 overlaps with the first electrode T2*s* of the second transistor T2 in the direction perpendicular to the base substrate 101, so that a signal on the first electrode T2*s* of the second transistor T2 may be protected from other signals.

For example, the first capacitor electrode Ca at least partially overlaps with the gate T1*g* of the first transistor T1 in the direction perpendicular to the base substrate 101. a via 301 may also be formed by the patterning in the first capacitor electrode Ca, and the via 301 exposes at least a portion of the gate T1*g* of the first transistor T1*d*.

At step S67, a third insulating layer 105 is formed on the second conductive layer 202. The third insulating layer may be, for example, an interlayer insulating layer. A via for coupling to a subsequently formed third conductive layer is formed in the third insulating layer. At least some of the vias correspond to the first and second insulating layer vias (e.g., the via 402, the via 405, the via 303, and the via 305) in location and extend through the first, second and third insulating layers.

At step S68, a third conductive material layer is formed on the third insulating layer 105, and is patterned to form a third conductive layer 203 as shown in FIG. 4C, that is, the third conductive material layer is patterned to form a data line 12, a second power supply line 250, a first connection electrode 231, a second connection electrode 232, and a third connection electrode 233, which are insulated from each other. The data line 12 and the second power supply line 250 extend in the first direction D1.

For example, as shown in FIG. 4C, the data line 12 overlaps with the first electrode T2*s* of the second transistor T2 in the direction perpendicular to the base substrate 101 and is electrically coupled to the first electrode T2*s* of the second transistor T2 through a via 305. The via 305, for example, penetrates through the first insulating layer 103, the second insulating layer 104, and the third insulating layer 105.

For example, as shown in FIGS. 4C and 6, the second power supply line 250 overlaps with the shielding electrode 221 in the direction perpendicular to the base substrate 101 and is electrically coupled to the shielding electrode 221 through a via 304. For example, the via 304 penetrates through the third insulating layer 105.

For example, as shown in FIG. 4C, the second power supply line 250 is electrically coupled to the first capacitor electrode Ca in the corresponding column of sub pixels through a via 302, and is electrically coupled to the first electrode T4s of the fourth transistor T4 through the via 303. For example, the via 302 penetrates through the third insulating layer 105, and the via 303 penetrates through the first insulating layer 103, the second insulating layer 104, and the third insulating layer 105.

For example, as shown in FIGS. 4C and 6, one end of the first connection electrode 231 is electrically coupled to the gate T1g of the first transistor T1, i.e., one end of the first connection electrode 231 is electrically coupled to the second capacitor electrode Cb, through the via 301 in the first capacitor electrode Ca and the via 401 in the insulating layer, and the other end of the first connection electrode 231 is electrically coupled to the first electrode of the third transistor T3 through the via 402, thereby electrically coupling the second capacitor electrode Cb to the first electrode T3s of the third transistor T3. For example, the via 401 penetrates through the second insulating layer 104 and the third insulating layer 105, and the via 402 penetrates through the first insulating layer 103, the second insulating layer 104, and the third insulating layer 105.

For example, as shown in FIG. 4C, one end of the second connection electrode 232 is electrically coupled to the reset voltage line through a via 403, and the other end of the second connection electrode 232 is electrically coupled to the sixth transistor T6 through a via 404, so that the first electrode T6s of the sixth transistor T6 may receive the first reset voltage Vinit1 from the reset voltage line 240. For example, the via 403 penetrates through the third insulating layer 105, and the via 404 penetrates through the first insulating layer 103, the second insulating layer 104, and the third insulating layer 105.

For example, as shown in FIGS. 4C and 6, the third connection electrode 233 is electrically coupled to the second electrode T5d of the fifth transistor T5 through a via 405, and serves to electrically coupled the second electrode T5d of the fifth transistor T5 to the first electrode 134 of the light emitting element. For example, the via 405 penetrates through the first insulating layer 103, the second insulating layer 104, and the third insulating layer 105.

At step S69, a fourth insulating layer 106 is formed on the third conductive layer 203. A via is formed in the fourth insulating layer for coupling to a subsequently formed fourth conductive layer. In some embodiments, for example, the fourth insulating layer 106 includes a first planarization layer. In other embodiments, for example, the fourth insulating layer 106 includes two layers: a passivation layer and a first planarization layer, and the via formed in the fourth insulating layer needs to penetrate through both the passivation layer and the first planarization layer. For example, the first planarization layer is on a side of the passivation layer distal to the third conductive layer.

At step S70, a fourth conductive material layer is formed on the fourth insulating layer 106, and is patterned to form the fourth conductive layer 204 as shown in FIG. 4D, that is, the fourth conductive material layer is patterned to form a third power supply line 260, a first power supply line 270, and a fourth connection electrode 234. The third power supply line 260 is coupled to the first power supply line 270, and is insulated from the fourth connection electrode 234.

For example, as shown in FIG. 4D, the plurality of first power supply lines 270 extend along the first direction D1 and are electrically coupled to the plurality of second power supply lines 250 through the vias 306 in a one-to-one correspondence. For example, the first power supply lines 270 overlap with the corresponding second power supply line 250 respectively in the direction perpendicular to the base substrate 101. For example, the vias 306 penetrate through the fourth insulating layer 106.

For example, as shown in FIG. 4D, the fourth connection electrode 234 overlaps with the third connection electrode 233 in the direction perpendicular to the base substrate 101, and the fourth connection electrode 234 is electrically coupled to the third connection electrode 233 through a via 307 penetrating through the fourth insulating layer 106.

For example, referring to FIGS. 5 and 6, the method for manufacturing the display substrate may further include forming a fifth insulating layer 107 on the fourth conductive layer 204, and forming a via in the fifth insulating layer 107 for coupling to a subsequently formed fifth conductive layer. For example, the fifth insulating layer 107 may be a second planarization layer. The fifth insulating layer via is used for coupling the drain of the first transistor to the first electrode of the light emitting element. The fifth insulating layer via may or may not overlap with the second electrode of the first transistor. In a case where the fifth insulating layer via does not overlap with the second electrode of the first transistor, a connection line may be additionally arranged in the third conductive layer, depending on the position and shape of the sub pixel arrangement structure, such depending on the position and shape of as the first electrode.

For example, the method for manufacturing the display substrate may further include forming a fifth conductive material layer on the fifth insulating layer 107, and performing a patterning process on the fifth conductive material layer to form a fifth conductive layer 205, that is, forming the fifth conductive layer 205 including a plurality of first electrodes 134 of the light emitting elements, which are insulated from each other.

For example, each of the first electrodes 134 includes a main body part 141 and a connection part 142. The main body part 141 is mainly used for driving the light emitting layer to emit light, and the connection part 142 is mainly used for electrically coupling to the pixel circuit.

For example, as shown in FIG. 6, the connection part 142 is electrically coupled to the fourth connection electrode 234 through the via 308 in the fifth insulating layer 107. For example, in the direction parallel to the base substrate 101, the via 308 is more distal to the main portion part 141 of the first electrode 134 than the via 307, that is, the via 308 is more distal to the aperture region 600 of the sub pixel. That is, the orthographic projection of the via 308 on the base substrate 101 is more distal to the orthographic projection of the aperture region 600 on the base substrate than the orthographic projection of the via 307 on the base substrate 101.

For example, as shown in FIG. 6, the method for manufacturing the display substrate may further include sequentially forming a pixel defining layer 108 on the fifth conductive layer 205, and forming an aperture region 600 in the pixel defining layer 108 corresponding to the main body part 141 of each first electrode 134, then forming a light emitting layer 136 at least in the aperture region 600, and forming a second electrode 135 on the light emitting layer.

Before the aperture region 600 is formed, the apertures for the different color sub pixels are implemented by adjusting the width of the first power supply line at the position corresponding to the orthographic projection of the plurality of apertures on the base substrate, and the ratio of the area ratio between the first portions of the two portions of the orthographic projection of the apertures divided by the first power supply line 270 to the area ratio between the second portions of the two portions of the orthographic projection of the apertures divided by the first power supply line 270 is in a certain range.

Optionally, while adjusting the width of the first power supply line at the position corresponding to the orthographic projection of the plurality of apertures on the base substrate, the width of the first power supply line at the position outside the position corresponding to the orthographic projection of the plurality of apertures on the base substrate is adjusted to keep the power supply line load balanced. Meanwhile, the extension directions of the first power supply line, the second power supply line, and the third power supply line may be adjusted, so that the overlapping area of each power supply line with the semiconductor layer is made as large as possible, thereby increasing the aperture ratio.

In the case where the forming one pixel includes forming four sub pixels including a red sub pixel, a blue sub pixel, a first green sub pixel, and a second green sub pixel, and the red sub pixel and the blue sub pixel are shared, forming apertures in one-to-one correspondence with the red sub pixel, the blue sub pixel, the first green sub pixel, and the second green sub pixel, respectively, to be divided into two portions by an orthographic projection of a first power supply line on the base substrate includes: in the case of the apertures including the aperture of the red sub pixel, the aperture of the blue sub pixel, the aperture of the first green sub pixel and the aperture of the second green sub pixel, the area ratio between the first portion of the orthographic projection of the aperture of the red sub pixel, the first portion of the orthographic projection of the aperture of the blue sub pixel, and the sum of the first portion of the orthographic projection of the aperture of the first green sub pixel and the first portion of the orthographic projection of the aperture of the second green sub pixel is equal to the area ratio between the second portion of the orthographic projection of the aperture of the red sub pixel, the second portion of the orthographic projection of the aperture of the blue sub pixel, and the sum of the second portion of the orthographic projection of the aperture of the first green sub pixel and the second portion of the orthographic projection of the aperture of the second green sub pixel, for example, and the area ratio is 1:1.04:1.644.

For example, a material of the semiconductor material layer includes, but is not limited to, a silicon-based material (amorphous silicon a-Si, polysilicon p-Si, etc.), a metal oxide semiconductor material (IGZO, ZnO, AZO, IZTO, etc.), and an organic material (hexathiophene, polythiophene, etc.).

For example, a material of the first conductive material layer, the second conductive material layer, the third conductive material layer, the fourth conductive material layer, the fifth conductive material layer and the second electrodes may include gold (Au), silver (Ag), copper (Cu), aluminum (Al), molybdenum (Mo), magnesium (Mg), tungsten (W) and alloys thereof; or a material of the first conductive material layer, the second conductive material layer, the third conductive material layer, the fourth conductive material layer, the fifth conductive material layer and the second electrodes may include a transparent metal oxide conductive material, such as Indium Tin Oxide (ITO), Indium Zinc Oxide (IZO), zinc oxide (ZnO), zinc aluminum oxide (AZO), or the like.

For example, each of the first insulating layer 103, the second insulating layer 104, the third insulating layer 105, the fourth insulating layer 106, and the fifth insulating layer 107 is an inorganic insulating layer made of, such as silicon oxide, silicon nitride, silicon oxynitride, or each of the first insulating layer 103, the second insulating layer 104, the third insulating layer 105, the fourth insulating layer 106, and the fifth insulating layer 107 is made of a metal oxynitride insulating material, such as aluminium oxide, titanium nitride, or the like. For example, some of the insulating layers, such as a first planarization layer and a second planarization layer, may also be made of an organic material, such as, Polyimide (PI), acrylate, epoxy, polymethyl methacrylate (PMMA), etc., which is not limited by the embodiments of the present disclosure. For example, the fourth insulating layer 106 and the fifth insulating layer 107 may include a planarization layer, respectively.

For example, the above patterning process may be a conventional photolithography process including, for example, coating, exposing, developing, baking, etching of a photoresist.

The above description is merely exemplary embodiments of the present disclosure and is not intended to limit the scope of the present disclosure, which is defined by the claims appended hereto.

What is claimed is:

1. A display substrate, comprising:
    a base substrate; and
    a plurality of sub pixels on the base substrate,
    wherein the plurality of sub pixels comprises:
    a first metal layer on the base substrate, the first metal layer comprising a plurality of first power supply lines;
    a first planarization layer on a side of the first metal layer distal to the base substrate;
    a first electrode layer on a side of the first planarization layer distal to the first metal layer and provided with a plurality of first electrodes spaced apart from each other; and
    a pixel defining layer on a side of the first electrode layer distal to the first planarization layer, and having a plurality of apertures which are in a one-to-one correspondence with the plurality of first electrodes and make the plurality of first electrodes exposed, the plurality of apertures being provided corresponding to sub pixels of at least two different colors, and
    wherein orthographic projections of the plurality of apertures corresponding to the sub pixels of at least two different colors on the base substrate each are divided by the orthographic projections of the plurality of first power supply lines on the base substrate into a first portion at a first side of one corresponding power supply line of the plurality of first power supply line and a second portion at a second side of the one corresponding first power supply line of the plurality of first power supply lines, and for the sub pixels of the at least two different colors, a first area ratio is a ratio between areas of the first portions of the orthographic projections of the apertures of the sub pixels of the at least two different colors on the base substrate, a second area ratio is a ratio between areas of the second portions of the orthographic projections of the apertures of the sub pixels of the at least two different colors on the base substrate, and a ratio between the first area ratio and the second area ratio is in a range from 0.8 to 1.2;
    wherein the sub pixels of the at least two different colors comprise first sub pixels of a first color,
    the plurality of first power supply lines extend in a first direction, the first portion and the second portion are arranged at two sides of one corresponding first power supply line in a second direction respectively, the first direction crosses over the second direction, the plurality of first power supply lines comprise first sub power supply lines in parallel with each other, orthographic projections of corresponding apertures of the first sub pixels are divided by orthographic projections of the first sub power supply lines on the base substrate into the first portions and the second portions, respectively, the first sub power supply line comprises a first repeating part and a second repeating part which are coupled to each other and are combined as a repeating unit, the first repeating part and the second repeating part extend along the first direction and have different line widths in the second direction, the orthogonal projection of the aperture of the first sub pixel on the base substrate overlaps with the orthogonal projections of the first repeating part and the second repeating part of a corresponding first sub power supply line on the base substrate, and an overlapping area of the orthogonal projection of the aperture of the first sub pixel on the base substrate with the orthogonal projection of the first repeating part on the base substrate is larger than an overlapping area of the orthogonal projection of the aperture of the first sub pixel on the base substrate with the orthogonal projection of the second repeating part on the base substrate; and wherein the sub pixels of the at least two different colors further comprise second sub pixels of a second color different from the first color, the plurality of first power supply lines further comprise second sub power supply lines arranged in parallel with the first sub power supply lines, and the second sub power supply lines and the first sub power supply lines are arranged alternately along the first direction, the second sub power supply line comprises a third repeating part, a fourth repeating part, and a fifth repeating part which are sequentially coupled to each other and are combined as a repeating unit, and the third repeating part, the fourth repeating part and the fifth repeating part extend along the first direction and have different line widths in the second direction, an orthographic projection of the second sub pixel on the base substrate overlaps with orthographic projections of the fourth repeating part and the fifth repeating part of a corresponding second sub power supply line on the base substrate, and an overlapping area of the orthographic projection of the aperture of the second sub pixel on the base substrate with the orthographic projection of the fifth repeating part on the base substrate is larger than an overlapping area of the orthographic projection of the aperture of the second sub pixel on the base substrate with the orthographic projection of the fourth repeating part on the base substrate.

2. The display substrate of claim 1, wherein the first sub pixel of the first color comprises a red sub pixel (R) or a blue sub pixel (B), with respect to a central axis along the first direction of the second repeating part, a central axis along the first direction of the first repeating part is distal to the second portion (R2, B2) of the orthogonal projection of the aperture of a corresponding red sub pixel (R) or a corresponding blue sub pixel (B), and the first repeating part is concave relative to the second repeating part on a side proximal to the second portion (R2, B2) of the orthogonal projection of the aperture of the corresponding red sub pixel (R) or the corresponding blue sub pixel (B).

3. The display substrate of claim 1, wherein
the sub pixels of the at least two different colors further comprise third sub pixels having a same second color as the second sub pixel, and
an orthographic projection of the aperture of the third sub pixel on the base substrate overlaps with an orthographic projection of the fifth repeating part of a corresponding second sub power supply line on the base substrate.

4. The display substrate of claim 3, wherein
the second and third sub pixels of the second color each comprise a green sub pixel,
a central axis along the first direction of the third repeating part, a central axis along the first direction of the fourth repeating part and a central axis along the first direction of the fifth repeating part are sequentially approaching the second portion (G2) of the orthographic projection of the aperture of a corresponding green sub pixel (G), the third repeating part is concave relative to the fourth repeating part at a side proximal to the second portion (G2) of the orthographic projection of the aperture of the corresponding green sub pixel (G), and the fifth repeating part is concave relative to the fourth repeating part at a side distal to the second portion (G2) of the orthographic projection of the aperture of the corresponding green sub pixel (G).

5. The display substrate of claim 4, wherein a line width of the first repeating part is in a range from 3 μm to 4.6 μm, a line width of the second repeating part is in a range from 4.5 μm to 6.9 μm, a line width of the third repeating part is in a range from 3 μm to 4.6 μm, a line width of the fourth repeating part is in a range from 5.3 μm to 8.1 μm, and a line width of the fifth repeating part is in a range from 2.4 μm to 3.6 μm.

6. The display substrate of claim 5, wherein the line width of the first repeating part is 3.8 μm, the line width of the second repeating part is 5.7 μm, the line width of the third repeating part is 3.8 μm, the line width of the fourth repeating part is 6.7 μm, and the line width of the fifth repeating part is 3.0 μm.

7. The display substrate of claim 1, further comprising:
a second metal layer which is on the base substrate and comprises a plurality of second power supply lines extending along the first direction, wherein orthogonal projections of the plurality of first power supply lines on the substrate and orthogonal projections of the plurality of second power supply lines on the substrate at least partially cross over each other in a direction perpendicular to the base substrate; and
a second planarization layer on the second metal layer, wherein the first metal layer is on the second planarization layer, and the plurality of first power supply lines are coupled to the plurality of second power supply lines by vias penetrating through the second planarization layer, respectively.

8. The display substrate of claim 7, further comprising a plurality of third power supply lines, wherein the plurality of third power supply lines extend along the second direction and electrically couple the plurality of first power supply lines together, orthographic projections of the plurality of third power supply lines on the base substrate and an orthographic projection of the aperture of each of the sub pixels on the base substrate do not overlap with each other in the direction perpendicular to the base substrate, and the plurality of third power supply lines and the plurality of first power supply lines are in a same layer and are a structure formed as a single piece.

9. The display substrate of claim 8, wherein each of the plurality of third power supply lines comprises a third sub power supply line and a fourth sub power supply line which are coupled to each other and are combined as a repeating unit, the third sub power supply lines and the fourth sub power supply lines are alternately arranged in the second direction, and the plurality of third power supply lines are arranged along the first direction;

the third sub power supply line comprises a sixth repeating part, a seventh repeating part, and an eighth repeating part which are sequentially coupled to each other and are combined as a repeating unit, the seventh repeating part extends along the second direction, an extending direction of the sixth repeating part crosses over both the first direction and the second direction, and an extending direction of the eighth repeating part crosses over both the first direction and the second direction and is different from the extending direction of the sixth repeating part; and the fourth sub power supply line comprises a ninth repeating part and a tenth repeating part, the ninth repeating part extends along the second direction, and an extending direction of the tenth repeating part crosses over both the first direction and the second direction.

10. The display substrate of claim 1, wherein the sub pixels of the at least two different colors comprises red sub pixels (R), blue sub pixels (B), and green sub pixels (G), the red sub pixels (R) and the blue sub pixels (B) are alternately arranged in the first direction and the second direction respectively, and the fourth sub power supply line is between the second portion (R2) of the orthogonal projection of the aperture of the red sub pixel (R) on the base substrate and the second portion (B2) of the orthogonal projection of the aperture of an adjacent blue sub pixel (B) on the base substrate along the first direction; and the green sub pixels (G) are arranged along the first direction and the second direction, and the third sub power supply line is between the second portions (G2) of orthographic projections of apertures of two adjacent green sub pixels (G) on the base substrate along the first direction.

11. The display substrate of claim 1, wherein one pixel comprises a red sub pixel (R) and a blue sub pixel (B), the orthographic projections of the apertures of the red sub pixel (R) and the blue sub pixel (B) each are divided into a first portion and a second portion by the orthographic projections of corresponding first power supply lines on the base substrate, and an area ratio between the first portion (R1) of the orthographic projection of the aperture of the red sub pixel (R) and the first portion (B1) of the orthographic projection of the aperture of the blue sub pixel (B) is R1/B1, and an area ratio between the second portion (R2) of the orthographic projection of the aperture of the red sub pixel (R) and the second portion (B2) of the orthographic projection of the aperture of the blue sub pixel (B) is R2/B2, wherein R1/B1=R2/B2=1:1.644, or one pixel comprises a red sub pixel (R) and a green sub pixel (G), an area ratio between the first portion (R1) of the orthographic projection of the aperture of the red sub pixel (R) and the first portion (G1) of the orthographic projection of the aperture of the green sub pixel (G) is R1/G1, and an area ratio between the second portion (R2) of the orthographic projection of the aperture of the red sub pixel (R) and the second portion (G2) of the orthographic projection of the aperture of the green sub pixel (G) is R2/G2, wherein R1/G1=R2/G2=1:1.04, or one pixel comprises a blue sub pixel (B) and a green sub pixel (G), an area ratio between the first portion (B1) of the orthographic projection of the aperture of the blue sub pixel (B) and the first portion (G1) of the orthographic projection of the aperture of the green sub pixel (G) is B1/G1, and an area ratio between the second portion (B2) of the orthographic projection of the aperture of the blue sub pixel (B) and the second portion (G2) of the orthographic projection of the aperture of the green sub pixel (G) is B2/G2, wherein B1/G1=B2/G2=1.644:1.04, or one pixel comprises a red sub pixel (R), a first green sub pixel (G') and a second green sub pixel (G"), an area ratio between the first portion (R1) of the orthographic projection of the aperture of the red sub pixel (R) and a sum of the first portion (G'1) of the orthographic projection of the aperture of the first green sub pixel (G') and the first portion (G"2) of the orthographic projection of the aperture of the second green sub pixel (G") is R1/(G'1+G"1), and an area ratio between the second portion (R2) of the orthographic projection of the aperture of the red sub pixel (R) and a sum of the second portion (G'2) of the orthographic projection of the aperture of the first green sub pixel (G') and the second portion (G"2) of the orthographic projection of the aperture of the second green sub pixel (G") is R2/(G'2+G"2), wherein R1/(G'1+G"1)=R2/(G'2+G"2)=1:1.04 one pixel comprises a blue sub pixel (B), a first green sub pixel (G') and a second green sub pixel (G"), or an area ratio between the first portion (B1) of the orthographic projection of the aperture of the blue sub pixel (B) and a sum of the first portion (G'1) of the orthographic projection of the aperture of the first green sub pixel (G') and the first portion (G"1) of the orthographic projection of the aperture of the second green sub pixel (G") is B1/(G'1+G"1), and an area ratio between the second portion (B2) of the orthographic projection of the aperture of the blue sub pixel (B) and a sum of the second portion (G'2) of the orthographic projection of the aperture of the first green sub pixel (G') and the second portion (G"2) of the orthographic projection of the aperture of the second green sub pixel (G") is B2/(G'2+G"2), wherein B1/(G'1+G"1)=B2/(G'2+G"2)=1.644:1.04.

12. The display substrate of claim 1, wherein the plurality of sub pixels comprises a plurality of pixel circuits for driving light emitting elements of the plurality of sub pixels to emit light, respectively; the plurality of pixel circuits in the plurality of sub pixels are arranged in multiple rows and multiple columns along a first direction and a second direction;

each of the plurality of pixel circuits comprises a driving sub circuit, a data writing sub circuit, a compensation sub circuit and a storage sub circuit;

the driving sub circuit comprises a control terminal, a first terminal and a second terminal, and is configured to be coupled to the light emitting element and control a driving current flowing through the light emitting element;

the data writing sub circuit comprises a control terminal, a first terminal and a second terminal, the control terminal of the data writing sub circuit is configured to receive a first scanning signal, the first terminal of the data writing sub circuit is configured to receive a data signal, the second terminal of the data writing sub circuit is electrically coupled to the driving sub circuit, and the data writing sub circuit is configured to write the data signal into the first terminal of the driving sub circuit in response to the first scanning signal;

the compensation sub circuit comprises a control terminal, a first terminal and a second terminal, the control terminal of the compensation sub circuit is configured to receive a second scanning signal, the first terminal and the second terminal of the compensation sub circuit are respectively electrically coupled to the control terminal and the second terminal of the driving sub circuit, and the compensation sub circuit is configured to perform a threshold compensation on the driving sub circuit in response to the second scanning signal;

the storage sub circuit is electrically coupled to the control terminal of the driving sub circuit and a first voltage terminal, and is configured to store the data signal; the storage sub circuit comprises a storage capacitor, a first capacitor electrode of the storage capacitor is coupled to the first voltage terminal, a second capacitor electrode is electrically coupled to the control terminal of the driving sub circuit, and the first voltage terminal is coupled to the plurality of first power supply lines; and the plurality of sub pixels comprise a first sub pixel and a second sub pixel directly adjacent to each other in the second direction, and the first capacitor electrode in the first sub pixel and the first capacitor electrode in the second sub pixel are in a same layer and are spaced apart from each other, the display substrate further comprises a plurality of data lines extending along the first direction, wherein the plurality of data lines are configured to provide data signals to the plurality of sub pixels, the plurality of second power supply lines are in a same layer as the plurality of data lines, and are electrically insulated from the plurality of data lines, the light emitting element of each of the plurality of sub pixels comprises the first electrode, a light emitting layer, and a second electrode, which are sequentially stacked on the base substrate, the first electrode is on a side of the light emitting layer proximal to the base substrate; and an orthogonal projection of the third power supply line on the base substrate and an orthogonal projection of the first electrode of each of the plurality of sub pixels on the base substrate do not overlap with each other in a direction perpendicular to the base substrate.

13. A display device, comprising the display substrate of claim 1.

14. A method for manufacturing a display substrate, comprising:

providing a base substrate;

forming a plurality of sub pixels on the base substrate, wherein each of the plurality of sub pixels comprises:

a first metal layer on the base substrate, the first metal layer comprising a plurality of first power supply lines;

a first planarization layer on a side of the first metal layer distal to the base substrate;

a first electrode layer on a side of the first planarization layer distal to the first metal layer and provided with a plurality of first electrodes spaced apart from each other; and a pixel defining layer on a side of the first electrode layer distal to the first planarization layer, and having a plurality of apertures which are in a one-to-one correspondence with the plurality of first electrodes and make the plurality of first electrodes exposed, the plurality of apertures being provided corresponding to sub pixels of at least two different colors, and wherein orthographic projections of the plurality of apertures corresponding to the sub pixels of at least two different colors on the base substrate each are divided by the orthographic projections of the plurality of first power supply lines on the base substrate into a first portion at a first side of one corresponding power supply line of the plurality of first power supply line and a second portion at a second side of the one corresponding first power supply line of the plurality of first power supply lines, and for the sub pixels of the at least two different colors, a first area ratio is a ratio between areas of the first portions of the orthographic projections of the apertures of the sub pixels of the at least two different colors on the base substrate, a second area ratio is a ratio between areas of the second portions of the orthographic projections of the apertures of the sub pixels of the at least two different colors on the base substrate, and a ratio between the first area ratio and the second area ratio is in a range from 0.8 to 1.2; and wherein the first power supply lines extend in a first direction, the first portion and the second portion are arranged in a second direction, the first direction crosses over the second direction, the sub pixels of the at least two different colors comprises a red sub pixel (R), a blue sub pixel (B), and a green sub pixel (G), the plurality of first power supply lines comprise first sub power supply lines and second sub power supply lines which are arranged in parallel to each other and are alternately arranged along the first direction, and each of orthographic projections of apertures of the corresponding red sub pixel (R) and the corresponding blue sub pixel (B) is divided by an orthographic projection of the first sub power supply line on the base substrate into the first portion (R1, B1) and the second portion (R2, B2), and an orthographic projection of an aperture of the green sub pixel (G) is divided by an orthographic projection of the second sub power supply line on the base substrate into the first portion (G1) and the second portion (G2), the first sub power supply line comprises a first repeating part and a second repeating part which are coupled to each other and are combined as a repeating unit, a central axis along the first direction of the first repeating part is distal to the second portion (R2, B2) of the orthogonal projection of the aperture of the corresponding red sub pixel (R) and the corresponding blue sub pixel (B) with respect to a central axis along the first direction of the second repeating part, the first repeating part is concave relative to the second repeating unit on a side proximal to the second portion (R2, B2) of the orthogonal projection of the aperture of the corresponding red sub pixel (R) and the corresponding blue sub pixel (B); and the orthographic projections of the red sub-pixel (R) and the blue sub pixel (B) on the base substrate overlap with the orthographic projections of the first repeating part and the second repeating part of a corresponding first sub power line on the substrate, respectively;

the second sub power supply line comprises a third repeating part, a fourth repeating part, and a fifth repeating part which are sequentially coupled to each other and are combined as a repeating unit; a central axis along the first direction of the third repeating part, a central axis along the first direction of the fourth repeating part and a central axis along the first direction of the fifth repeating part are sequentially approaching the second portion (G2) of the orthographic projection of the aperture of a corresponding green sub pixel (G), the third repeating part is concave relative to the fourth repeating unit at a side proximal to the second portion (G2) of the orthographic projection of the aperture of the corresponding green sub pixel (G), and the fifth repeating part is concave relative to the fourth repeating unit at a side distal to the second portion (G2) of the orthographic projection of the aperture of the corresponding green sub pixel (G), and the orthographic projection of the green sub pixel (G) on the base substrate overlaps with the orthographic projections of the fourth repeating part and the fifth repeating part of a corresponding second sub power supply line on the base substrate or overlaps with the orthographic projection of the fifth repeating part of the corresponding second sub power supply line on the base substrate.

15. The method of claim 14, further comprising:
adjusting widths of the first power supply lines at positions where the orthographic projections of the apertures of the sub pixels of the at least two different colors on the base substrate such that the ratio between the first area ratio and the second area ratio is in a range from 0.8 to 1.2.

16. The method of claim 15, further comprising adjusting widths of the first power supply lines at positions outside the positions where the orthographic projections of the apertures of the sub pixels of the at least two different colors on the base substrate while adjusting the widths of the first power supply lines at positions where the orthographic projections of the apertures of the sub pixels of the at least two different colors on the base substrate are located.

17. The method of claim 14, wherein a line width of the first repeating part is 3.8 μm, a line width of the second repeating part is 5.7 μm, a line width of the third repeating part is 3.8 μm, a line width of the fourth repeating part is 6.7 μm, and a line width of the fifth repeating part is 3.0 μm.

* * * * *